United States Patent
Leng

(10) Patent No.: US 11,670,439 B2
(45) Date of Patent: Jun. 6, 2023

(54) THIN-FILM RESISTOR (TFR) MODULE

(71) Applicant: Microchip Technology incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/499,594

(22) Filed: Oct. 12, 2021

(65) Prior Publication Data

US 2023/0013766 A1 Jan. 19, 2023

Related U.S. Application Data

(60) Provisional application No. 63/222,228, filed on Jul. 15, 2021.

(51) Int. Cl.

| | |
|---|---|
| *H01C 7/00* | (2006.01) |
| *H01C 17/232* | (2006.01) |
| *H01L 23/522* | (2006.01) |
| *H01C 17/12* | (2006.01) |
| *H01L 49/02* | (2006.01) |

(52) U.S. Cl.
CPC .......... *H01C 7/006* (2013.01); *H01C 17/12* (2013.01); *H01C 17/232* (2013.01); *H01L 23/5228* (2013.01); *H01L 28/24* (2013.01)

(58) Field of Classification Search
CPC ...... H01C 7/006; H01C 17/12; H01C 17/232; H01L 23/5228; H01L 28/24
See application file for complete search history.

(56) References Cited

U.S. PATENT DOCUMENTS

| | | | |
|---|---|---|---|
| 10,553,336 B2 * | 2/2020 | Leng | ............ H01C 7/006 |
| 10,643,887 B2 | 5/2020 | Leng | |
| 10,818,748 B2 | 10/2020 | Leng et al. | |

(Continued)

OTHER PUBLICATIONS

Dobkin, Daniel M. et al., " Principles of Chemical Vapor Deposition: What's Going on Inside the Reactor," ISBN: 1402012489, Entire Book (1 page abstract included), Apr. 30, 2003.

(Continued)

*Primary Examiner* — Kyung S Lee
(74) *Attorney, Agent, or Firm* — Slayden Grubert Beard PLLC

(57) ABSTRACT

A damascene method for manufacturing a thin film resistor (TFR) module is provided. A pair of heads are formed spaced apart from each other. A dielectric region is deposited over the pair of heads, and an opening extending over both heads is formed in the dielectric region. A TFR layer is deposited over the dielectric region and extending into the opening to define a cup-shaped TFR layer structure including (a) a laterally-extending TFR element base conductively connected to both heads and (b) vertical ridges extending upwardly from the laterally-extending TFR element base. A high density plasma (HDP) ridge removal process is performed to remove or shorten the vertical ridges from the cup-shaped TFR layer structure, thereby defining a TFR element having removed or shorted vertical ridges. The removal or shortening of the vertical ridges may improve the temperature coefficient of resistance (TCR) characteristic of the TFR element.

28 Claims, 27 Drawing Sheets

(56) References Cited

U.S. PATENT DOCUMENTS

| | | | |
|---|---|---|---|
| 2003/0067014 A1* | 4/2003 | Tsuruta | H01L 21/84 257/E21.573 |
| 2005/0003673 A1* | 1/2005 | Mahdavi | H01L 21/32136 257/E21.311 |
| 2014/0184381 A1* | 7/2014 | Hao | H01L 28/24 29/25.42 |
| 2016/0372420 A1 | 12/2016 | Leng et al. | 438/384 |
| 2019/0109186 A1 | 4/2019 | Leng | |
| 2019/0348494 A1 | 11/2019 | Leng et al. | |

OTHER PUBLICATIONS

International Search Report and Written Opinion, Application No. PCT/US2022/012430, 13 pages, dated May 6, 2022.

\* cited by examiner

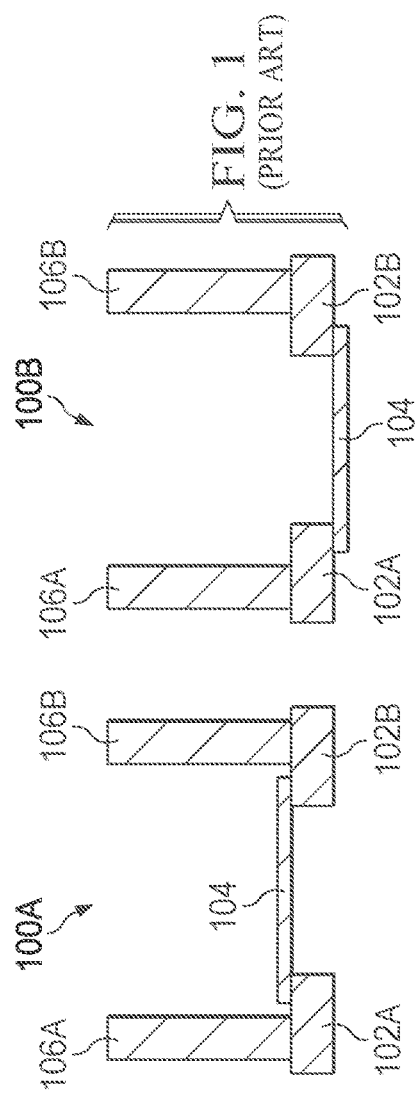
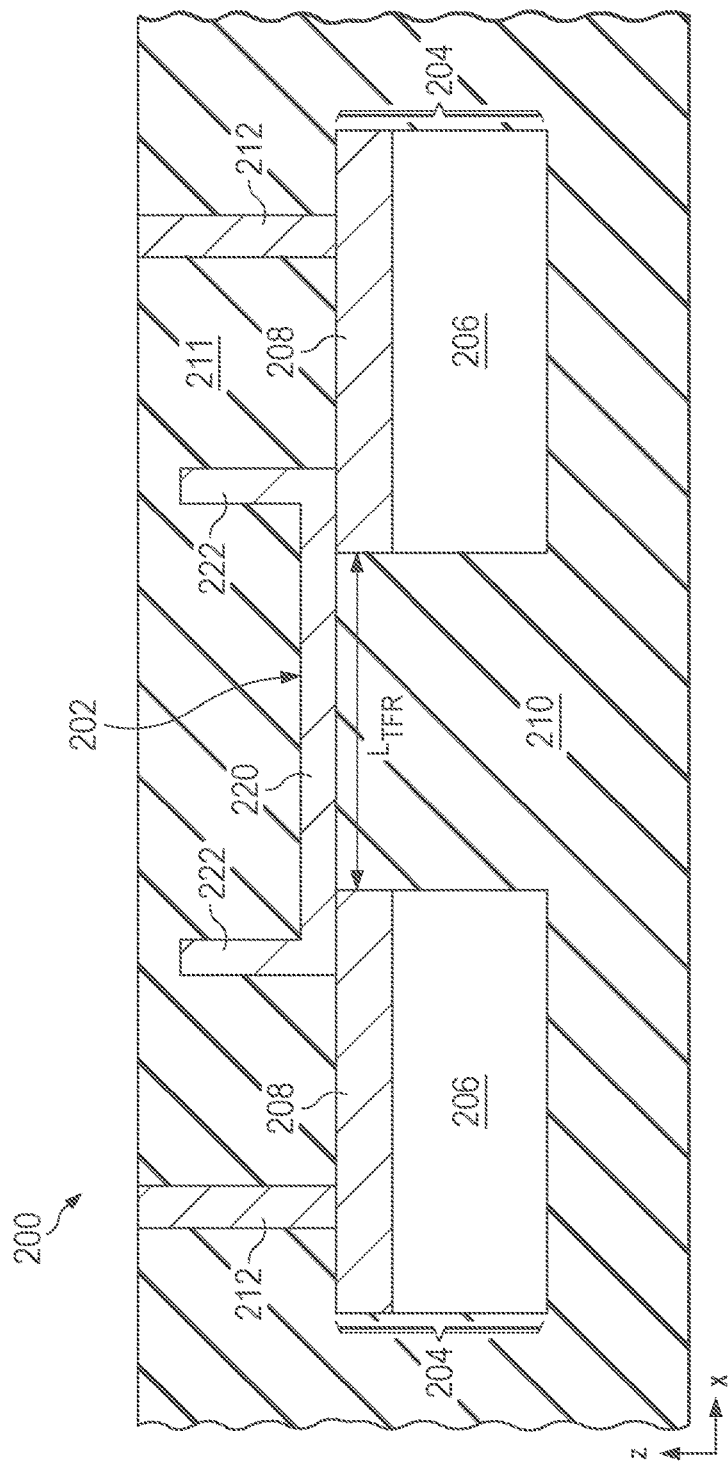
FIG. 1 (PRIOR ART)
FIG. 2A (PRIOR ART)

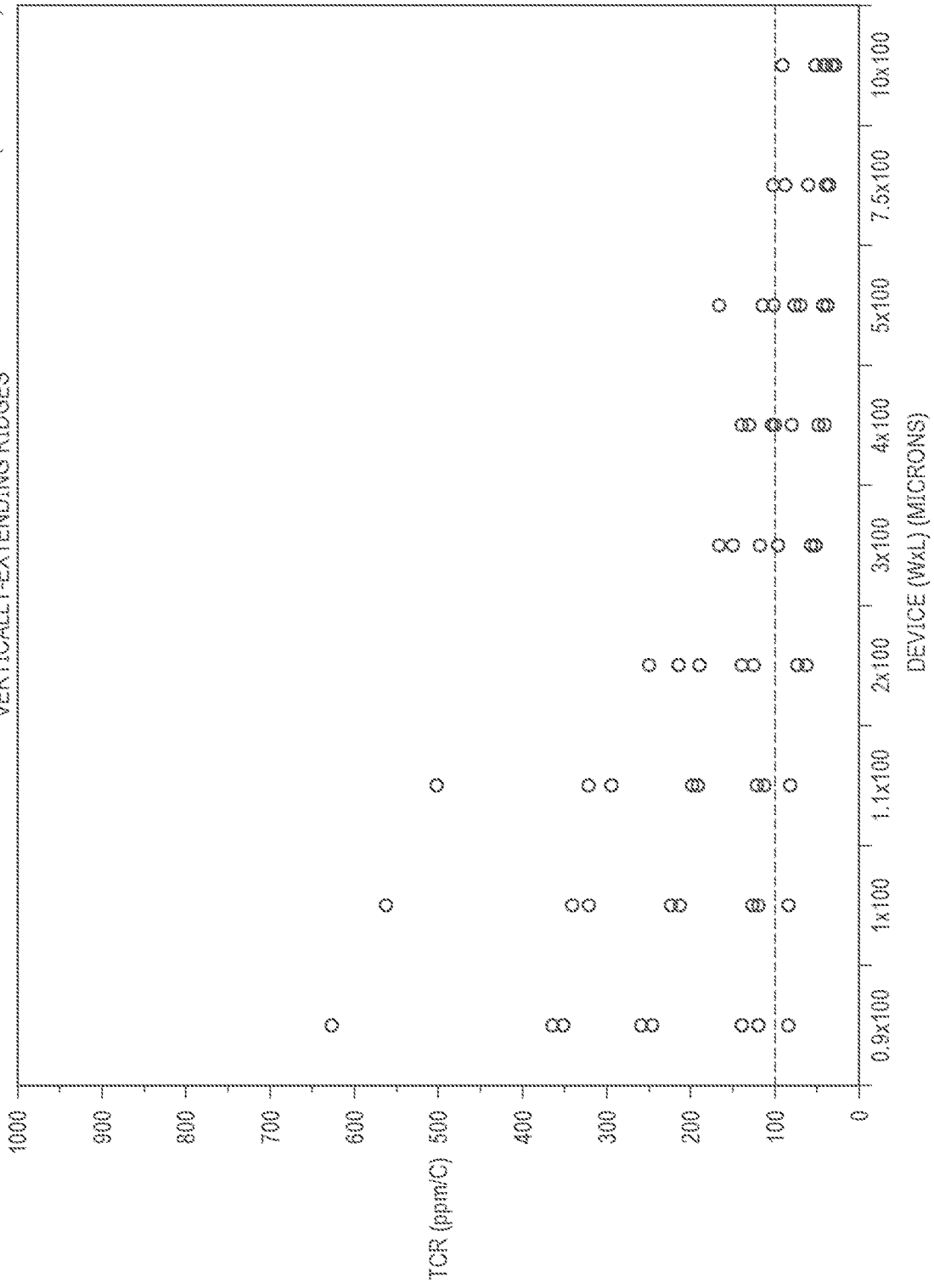

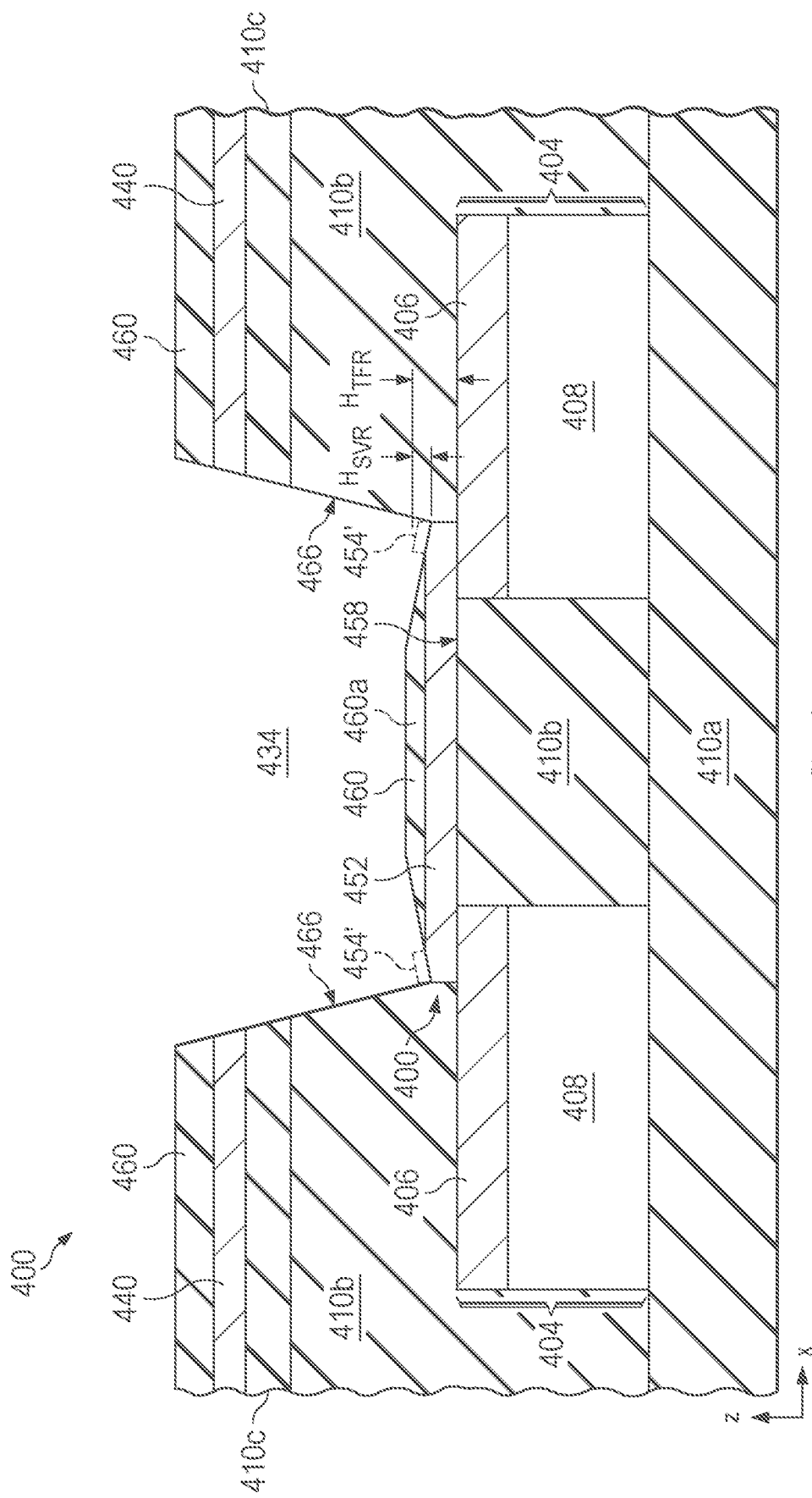

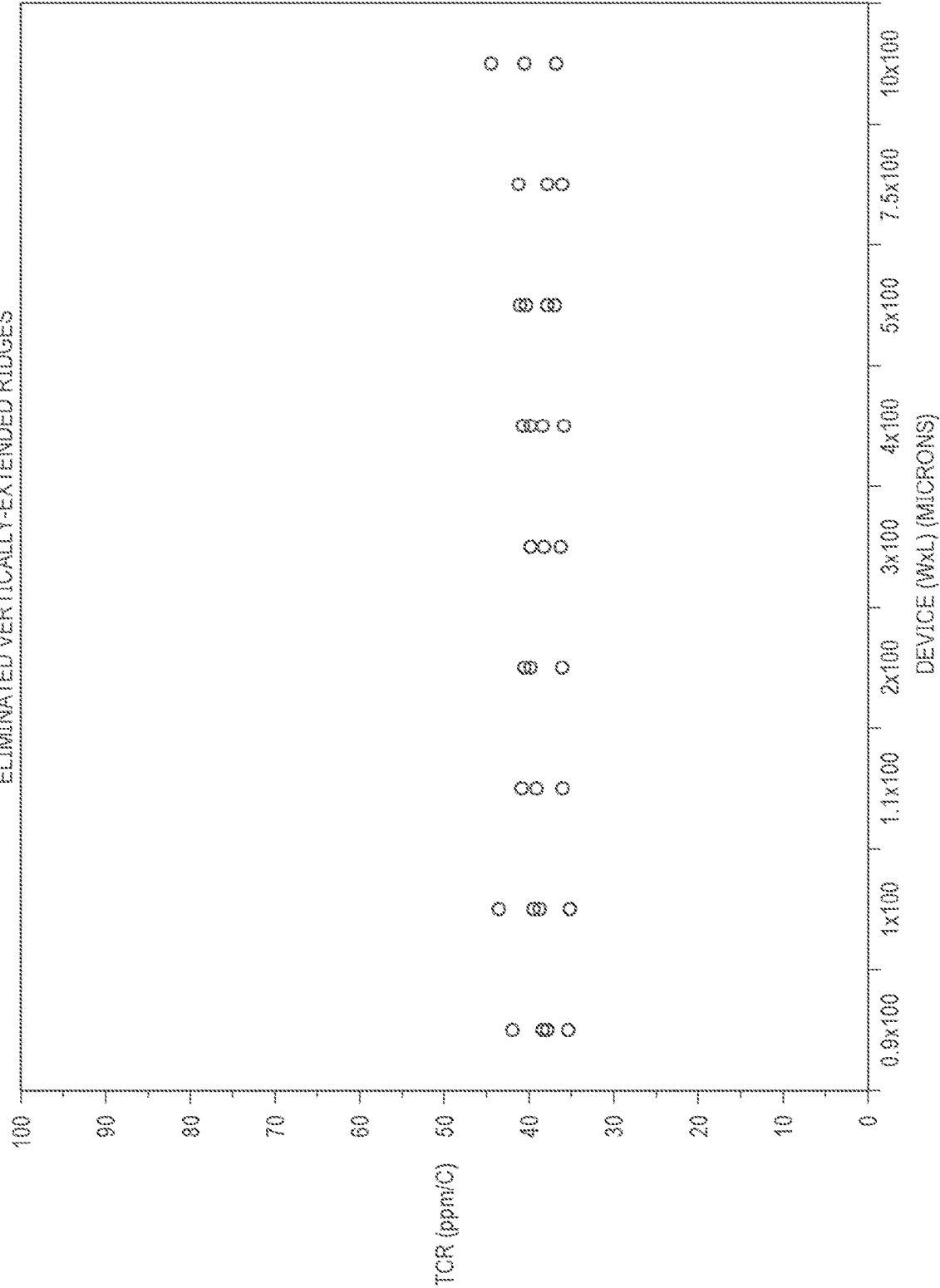

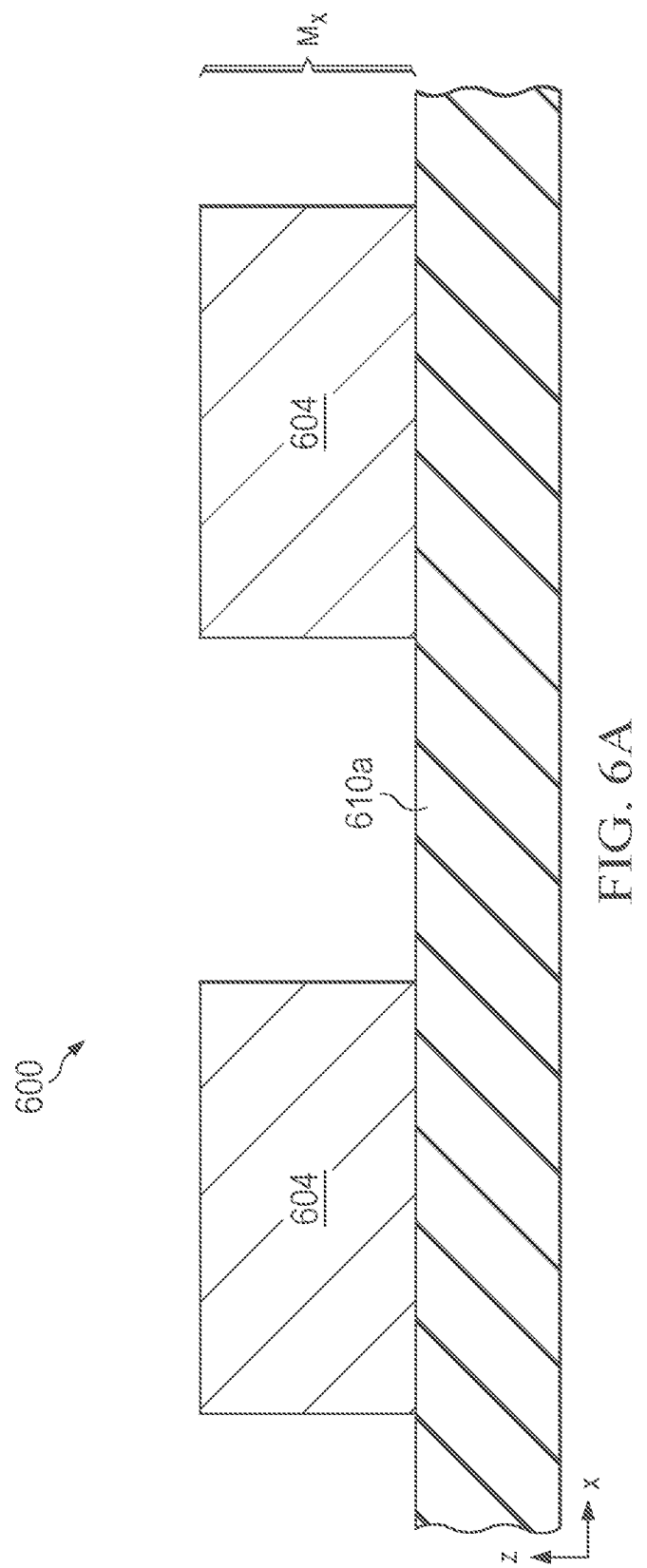

THIN-FILM RESISTOR (TFR) MODULE

This application claims priority to commonly owned U.S. Provisional Patent Application No. 62/222,228 filed Jul. 15, 2021, the entire contents of which are hereby incorporated by reference for all purposes.

TECHNICAL FIELD

The present disclosure relates to thin-film resistor (TFR) modules formed in integrated circuit (IC) devices, and more particularly to TFR modules including a TFR element having removed or shortened vertical ridges, and methods of forming such TFR modules.

BACKGROUND

With more features being packed into individual semiconductor chips, there is an increased need to fit large numbers of passive components, such as resistors, into the circuits. Some resistors can be created through ion implantation and diffusion, such as poly resistors. However, such resistors typically have high variations in resistance value, and may also have resistance values that change drastically as a function of temperature. A technique for constructing integrated resistors, called Thin-Film Resistors (TFRs), typically improves integrated resistor performance. TFRs are often formed from silicon-chromium (SiCr), silicon-silicon carbide-chromium (SiCCr), TaN, nickel-chromium (NiCr), aluminum-doped nickel-chromium (AlNiCr), or titanium-nickel-chromium (TiNiCr), for example.

FIG. 1 shows a cross-sectional view of two example TFR modules 100A and 100B implemented using conventional techniques. The fabrication of a conventional TFR module 100A or 100B typically requires three added mask layers, with reference to a background fabrication process for the relevant IC device. In particular, a first added mask layer may be used to create TFR heads 102A and 102B, a second added mask layer may be used to create a TFR element 104, and a third added mask layer may be used to create TFR vias 106A and 106B. As shown, the TFR element 104 of TFR 100A is formed across the top of the TFR heads 102A and 102B, while the TFR element 104 of TFR 100B is formed across the bottom of the TFR heads 102A and 102B, but each design typically uses three added mask layers.

Other TFR modules are formed by a damascene process, which may reduce the number of added mask layers needed to form the TFR module. A damascene process, often used for forming copper interconnects in an IC device, may include patterning a dielectric region to form open trenches where copper (or other metal) is intended to be formed. A copper diffusion barrier layer (e.g., a tantalum/tantalum nitride (Ta/TaN) bi-layer) is deposited, followed by deposition of a copper seed layer, followed by a bulk copper fill, e.g., using an electro-chemical plating process. A chemical-mechanical planarization (CMP) process may then be used to remove any excess copper and barrier layer material. The copper remaining in each trench functions as a conductor. A dielectric barrier layer, e.g., silicon nitride (SiN) or silicon carbide (SiC), is then typically deposited over the wafer to prevent copper diffusion into neighboring silicon, thereby improving device reliability.

FIG. 2A shows an example TFR module 200 formed using a damascene process including a single added mask layer. TFR module 200 includes a TFR element 202 formed on a pair of spaced-apart TFR heads 204 formed over a field oxide region 210. Each TFR head 204 may comprise a silicided structure including a polysilicon region 206 having a silicide contact layer 208 formed thereon. A TFR contact 212 may be connected to the silicide contact layer 208 formed on each respective TFR head 204.

The TFR element 202 is formed by a damascene process including forming an opening in a pre-metal dielectric (PMD) region 211 and depositing a TFR element film into the opening to form the TFR element 202, such that the TFR element 202 includes a horizontally-extending base 220 and vertically-extending ridges (sidewalls) 222 extending upwardly from perimeter edges of the horizontally-extending base 220. The vertically-extending ridges 222 typically have a vertical height substantially greater than 2,000 Å. A temperature coefficient of resistance (TCR) of the TFR element 202 may be influenced by the vertically-extending ridges 222 of the TFR element 202. For example, the TCR of the TFR element 202 may vary as a function of the width of the TFR element 202 along the y-axis direction (into the page), i.e., perpendicular to the TFR element length $L_{TFR}$ along the x-axis direction. FIG. 2B provides a graph showing the TCR as a function of TFR width for an example set of TFR instances having a construction represented by TFR module 200, wherein the set of TFR instances have a common TFR element length ($L_{TFR}$) of 100 microns but a different TFR element width ranging from 0.9 to 10 microns.

There is a need for improved TFR modules for integrated circuits, and methods of construction. For example, there is a need or advantage for TFR modules constructed using a reduced number of mask layers, e.g., as compared with conventional TFRs 100A and 100B discussed above, and with a temperature coefficient of resistance (TCR) that is close to zero (e.g., in the range of −100 ppm/° C. to +100 ppm/° C.) and having a lower dependence on the TFR element width, e.g., as compared with certain existing constructions. There is also a need in some applications for such TFR module that provide a sheet resistance $R_s$ of about 1 kΩ/square, for example.

SUMMARY

The present disclosure provides thin-film resistors (TFRs) that may be integrated in IC structures in a modular manner, and are thus referred to herein as "TFR modules," and methods for forming such TFR modules. In particular, the disclosure provides TFR modules having a TFR element with vertically-extending TFR element ridges (also referred to simply as vertical ridges) that have been removed or vertically shortened using a high density plasma (HDP) ridge removal process, and example methods of forming such TFR elements with reduced vertically-extending TFR element ridges. For example, the disclosure provides TFR modules having a TFR element without vertical ridges, or with vertical ridges having a height of less than 200 Å, as a result of an HDP ridge removal process, and example methods of forming such TFR elements.

In some examples, the TFR element is formed by (a) forming a cup-shaped TFR layer structure including a laterally-extending TFR element base and vertical ridges (sidewalls) extending upwardly from the perimeter of the laterally extending TFR element base, and (b) performing an HDP ridge removal process to remove or shorten the vertical ridges, thereby defining a TFR element including the laterally-extending TFR element base and shortened or removed vertical ridges. In some examples, the HDP ridge removal process for removing or shortening the vertical ridges includes (a) depositing a cap layer and (b) performing a high density plasma sputter etch that removes or shortens the vertical ridges, wherein the cap layer protects the laterally-extending TFR element base from the sputter etch. In some examples, a bulk fill process is performed after the HDP ridge removal process to fill in an opening over the TFR element (e.g., with an oxide or nitride fill material).

In some examples, the TFR element with removed or shortened vertical ridges may be formed between a polysilicon layer (e.g., used for forming gates or other components of complementary metal-oxide-semiconductor (CMOS) transistors) and a first metal interconnect layer (metal-1 or $M_1$ layer). In other examples, the TFR element with removed or shortened vertical ridges may be formed between two metal interconnect layers $M_x$ and $M_{x+1}$. In either case, the TFR element may be formed using a damascene approach with a single mask layer as compared with a background CMOS fabrication process.

TFR elements with removed or shortened vertical ridges, as disclosed herein, may have improved temperature coefficient of resistance (TCR) characteristics as compared with TFR elements with full-height vertical ridges (i.e., vertical ridges that have not been removed or shortened as disclosed herein). For example, as discussed below with reference to FIG. 5, a variation of the TCR as a function of the TFR element width may be significantly lower for a TFR element with removed or shortened vertical ridges (as disclosed herein) as compared with a corresponding TFR with full-height vertical ridges.

One aspect provides a method for manufacturing TFR module. The method includes forming a pair of heads spaced apart from each other, depositing a dielectric region over the pair of heads, and forming an opening in the dielectric region, the opening extending over each head of the pair of heads. A TFR layer is deposited over the dielectric region and extends into the opening to define a cup-shaped TFR layer structure including (a) a laterally-extending TFR element base conductively connected to both heads and (b) vertical ridges extending upwardly from the laterally-extending TFR element base. A high density plasma (HDP) ridge removal process is performed to remove or shorten the vertical ridges from the cup-shaped TFR layer structure, thereby defining a TFR element having removed or shorted vertical ridges.

In one example, forming the opening in the dielectric region includes depositing a photoresist layer, patterning a photoresist opening in the photoresist layer, the patterned photoresist opening extending laterally over at least a portion of each head of the pair of heads, and etching through the patterned photoresist opening to form the opening in the dielectric region.

In one example, the high density plasma ridge removal process includes depositing a cap layer on the laterally-extending TFR element and performing a high density plasma sputter etch that removes or shortens the vertical ridges.

In one example, a bulk fill process is performed after the high density plasma sputter etch to fill the opening with an oxide material.

In one example, the cap layer comprises silicon oxide. In another example, the cap layer comprises silicon nitride.

In one example, the high density plasma sputter etch forms inclined sidewalls on opposing sides of the opening.

In one example, the high density plasma sputter etch removes a full height of the vertical ridges.

In one example, each of the pair of heads comprises a polysilicon structure having a silicide layer formed thereon. In another example, each of the pair of heads comprises a metal structure formed in a metal interconnect layer.

In some examples, the TFR layer comprises silicon-chromium (SiCr) or silicon-silicon carbide-chromium (SiCCr).

In one example, an anneal is performed after depositing the TFR layer but before performing the high density plasma process, wherein the anneal alters a temperature coefficient of resistance (TCR) of the TFR layer.

In some examples, the anneal achieves a TCR of the TFR layer of TCR of 0±50 ppm/° C. In some examples, the anneal achieves a TCR of the TFR layer of TCR of 0±10 ppm/° C. Further, in some examples, the anneal is performed at a temperature in the range of 450° C. to 550° C.

In one example, the method includes performing a chemical mechanical polishing (CMP) process to remove portions of the TFR layer outside the opening.

In one example, the method includes forming a pair of vertically-extending contacts, each conductively connected with a respective one of the pair of heads, and forming a pair of upper connection elements, each upper connection element conductively connected with a respective one of the vertically-extending contacts.

Another aspect provides a TFR module formed by a method including forming a pair of heads spaced apart from each other; depositing a dielectric region over the pair of heads; forming an opening in the dielectric region, the opening extending over each head of the pair of heads; depositing a TFR layer over the dielectric region and extending into the opening to define a cup-shaped TFR layer structure including (a) a laterally-extending TFR element base conductively connected to both heads and (b) vertical ridges extending upward from the laterally-extending TFR element base; and performing a high density plasma ridge removal process to remove or shorten the vertical ridges.

Another aspect provides a TFR module including a pair of spaced-apart heads, and a TFR element including a laterally-extending TFR element base conductively connected to both heads to thereby define a conductive connection between the spaced-apart heads. The TFR module further includes a first dielectric region above the pair of heads which first dielectric region includes a pair of inclined sidewalls extending upwardly from respective edges of the TFR element, and a second dielectric region between the pair of inclined sidewalls of the first dielectric region, wherein the second dielectric region has at least one different material property than the first dielectric region.

In one example, a maximum height of the TFR element is less than 1,000 Å.

In one example, the TFR element is free from ridges extending vertically from the laterally-extending TFR element base.

In one example, the TFR element includes vertical ridges extending upwardly from the laterally-extending TFR element base, each vertical ridge having a vertical height of less than 200 Å.

In one example, the pair of spaced-apart heads are spaced apart from each other in a first lateral direction; the TFR element has a lateral width in a second lateral direction perpendicular to the first lateral direction; and the TFR element includes vertical ridges extending upwardly from the laterally-extending TFR element base, each vertical ridge having a vertical height of less than 10% of the lateral width of the TFR element. In one example, each vertical ridge having a vertical height of less than 1% of the lateral width of the TFR element. In one example, each vertical ridge having a vertical height of less than 0.1% of the lateral width of the TFR element.

In one example, a dielectric constant of the second dielectric region is different from a dielectric constant of the first dielectric region.

In one example, each of the heads comprises a polysilicon structure having a silicide layer formed thereon. In another example, each of the heads comprises a metal structure formed in a metal interconnect layer.

BRIEF DESCRIPTION OF THE DRAWINGS

Example aspects of the present disclosure are described below in conjunction with the figures, in which:

FIG. 1 is a cross-sectional view of two example known thin-film resistors (TFR);

FIG. 2A is a cross-sectional view of an example known TFR formed using a damascene process and including a TFR element having vertical ridges (sidewalls);

FIG. 2B is a graph showing a dependence of TCR as a function of TFR element width for the TFR construction shown in FIG. 2A;

FIGS. 4A-4L illustrate an example process for forming an example TFR having removed or shortened vertical ridges;

FIG. 5 is a graph showing a dependence of TCR as a function of TFR element width for the example TFR shown in FIG. 4L; and FIGS. 6A-6K illustrate another example process for forming an example TFR having removed or shortened vertical ridges.

DETAILED DESCRIPTION

The present disclosure provides TFR modules having a TFR element with vertically-extending TFR element ridges (also referred to simply as vertical ridges) that have been removed or vertically shortened, and example methods of forming such TFR elements with vertically-extending TFR element ridges. As discussed below, removing or shortening the vertical ridges of the TFR element may improve temperature coefficient of resistance (TCR) characteristics of the TFR element, e.g., as compared with TFR elements with full-height vertical ridges (i.e., vertical ridges that have not been removed or shortened as disclosed herein).

Figure 3:
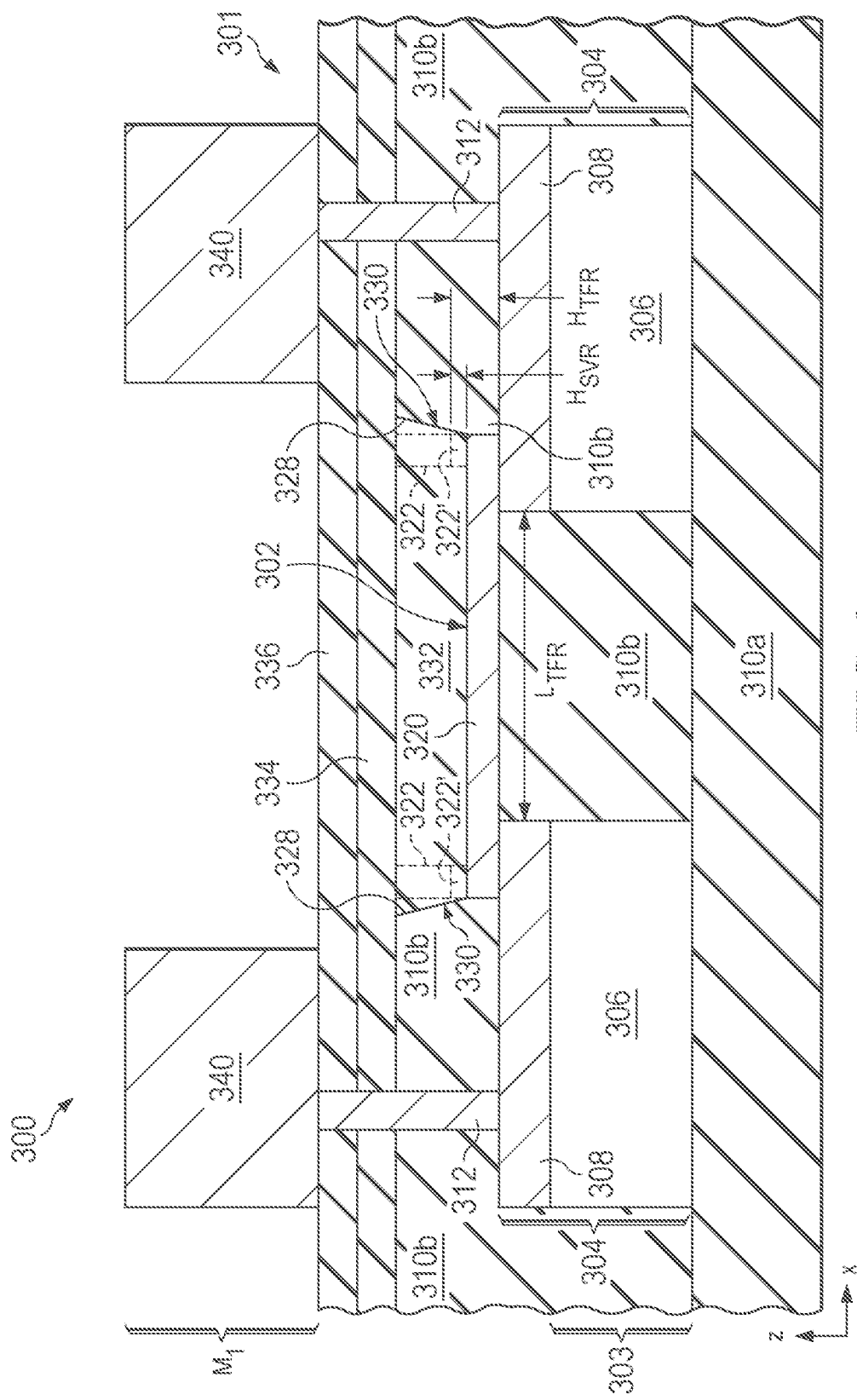
FIG. 3 is a cross-sectional view of an example TFR having removed or shortened vertical ridges (sidewalls), according to one example.

FIG. 3 is a cross-sectional view of an example thin-film resistor (TFR) module 300 including a TFR element 302 with removed or shortened vertical ridges, according to one example. The TFR element 302 is formed between a polysilicon layer 303 and a first metal interconnect layer $M_1$ (also referred to as a metal-1 layer).

As shown, the TFR element 302 of the example TFR module 300 is formed on a pair of spaced-apart TFR heads 304, each comprising a silicided polysilicon structure including a polysilicon structure 306 having a metal silicide layer 308 formed thereon. Each TFR head 304 is contacted by a respective upper TFR connection elements 340 through a respective TFR contact 312. Each TFR contact 312 may be conductively connected to the metal silicide layer 306 of a respective TFR head 304. Each upper TFR connection element 340 may be formed in metal interconnect layer $M_1$. In the illustrated example, metal interconnect layer $M_1$ may be formed over a phosphosilicate glass (PSG) layer 334 and an un-doped silicate glass (USG) cap oxide layer 336 deposited on the structure.

The TFR element 302 may be formed by a damascene process including forming an opening in a dielectric region 310b (e.g., pre-metal dielectrics, PMD), which dielectric region 310b is formed over a field oxide region 310a and TFR heads 304, and depositing a TFR element layer in the wide opening. The TFR element layer deposited in the wide opening defines a cup-shaped TFR layer structure including a horizontally-extending TFR element base 320 and vertically-extending ridges (sidewalls) 322 extending upwardly from perimeter edges of the TFR element base 320.

The vertically-extending ridges 322 of the cup-shaped TFR layer structure—also referred to herein as vertical ridges 322—may be fully or partially removed by a high density plasma (HDP) ridge removal process. As discussed below in more detail, the HDP ridge removal process may partially or completely remove the vertical ridges 322 (while protecting the TFR element base 320 from removal), and may define an opening 328 in the dielectric region 310b with inclined (i.e., non-vertical) sidewalls 330 extending up from the TFR element base 320. A bulk fill process may then be performed to fill the opening 328 with a dielectric material 332, which may have a different dielectric constant (and/or other different material property) than the dielectric region 310b outside the opening 328.

In some examples, the HDP ridge removal process removes a partial height of each vertical ridge 322, leaving shortened vertical ridges 322'. Thus, the TFR element 302 of the fully formed TFR module 300 includes the horizontally-extending TFR element base 320 and the shortened vertical ridges 322' extending upwardly from perimeter edges of the horizontally-extending TFR element base 320.

In other example, the HDP ridge removal process completely removes the vertical ridges 322, such that the TFR element 302 of the fully formed TFR module 300 includes only the horizontally-extending TFR element base 320 with no shortened vertical ridges 322'.

In either case (i.e., partial removal or complete removal of the vertical ridges 322), in some examples a maximum vertical height $H_{TFR}$ of the TFR element 302, including the horizontally-extending TFR element base 320 and (optionally) shortened vertical ridges 322', is less than 1,000 Å. In some examples, the maximum vertical height $H_{TFR}$ of TFR element 302 is less than 600 Å.

In some examples involving only a partial removal of the vertical ridges 322, a vertical height $H_{SVR}$ of each shortened vertical ridge 322' is less than 200 Å. In some examples, the vertical height $H_{SVR}$ of each shortened vertical ridge 322' is less than 10% of the y-direction width of the horizontally-extending TFR element base 320, less than 1% of the y-direction width of the TFR element base 320, or less than 0.1% of the y-direction width of the horizontally-extending TFR element base 320, depending on the particular process parameters.

TFR element 302, with the vertical ridge 322 removed or shortened, may have improved TCR characteristics as compared with a TFR element including non-shortened vertical ridges (e.g., as shown in FIG. 2A). For example, as discussed below with reference to FIG. 5, a variance of the TCR of TFR element 302 (with removed or shortened vertical ridges) as a function of the TFR element width (in the y-axis direction, into the page) is significantly less than the corresponding width-dependent TCR variance of a TFR element with full-height vertical ridges.

Figure 4A:
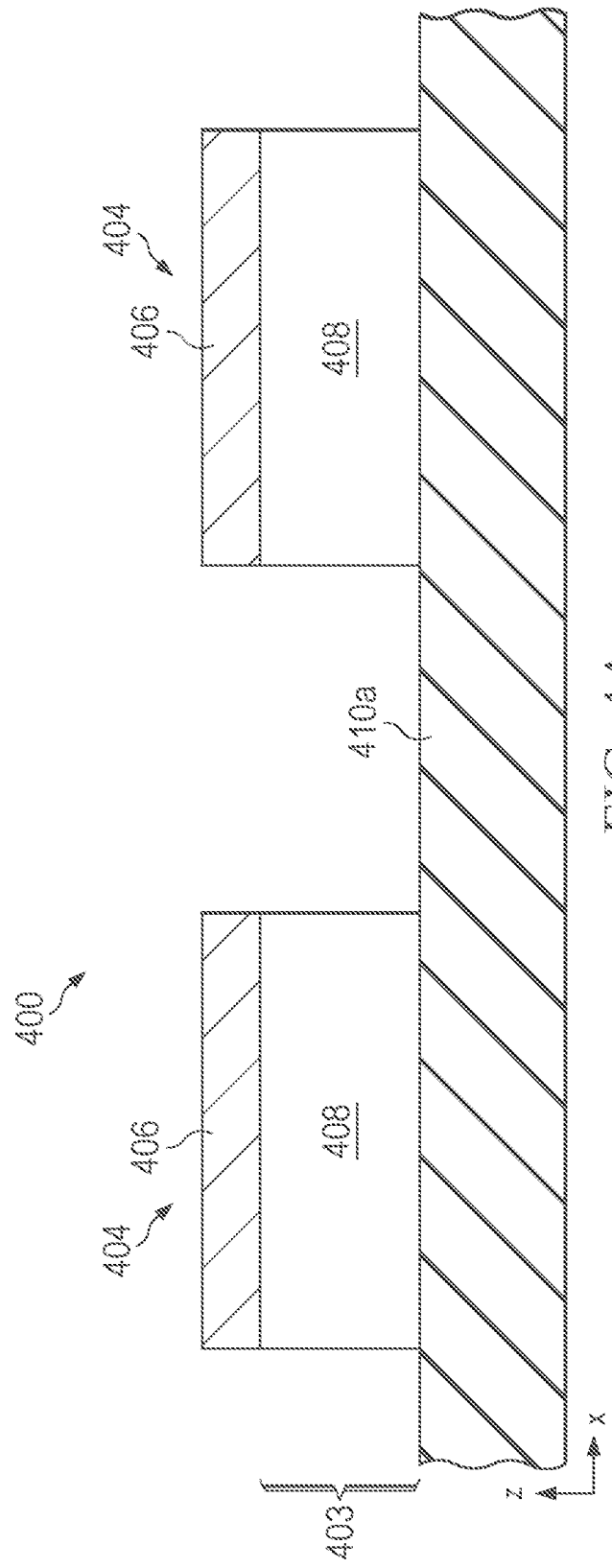
Figure 4B:
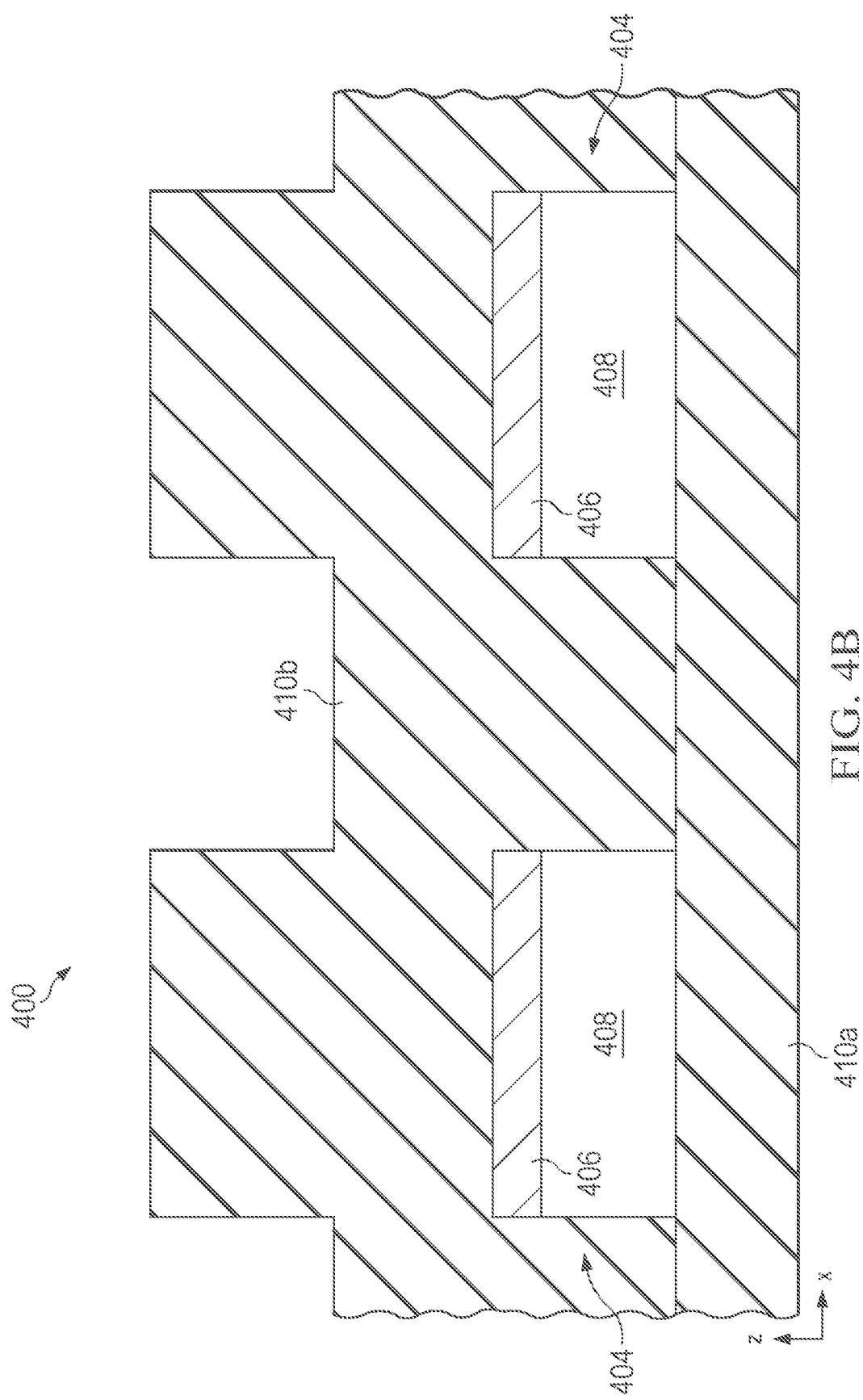
Figure 4C:
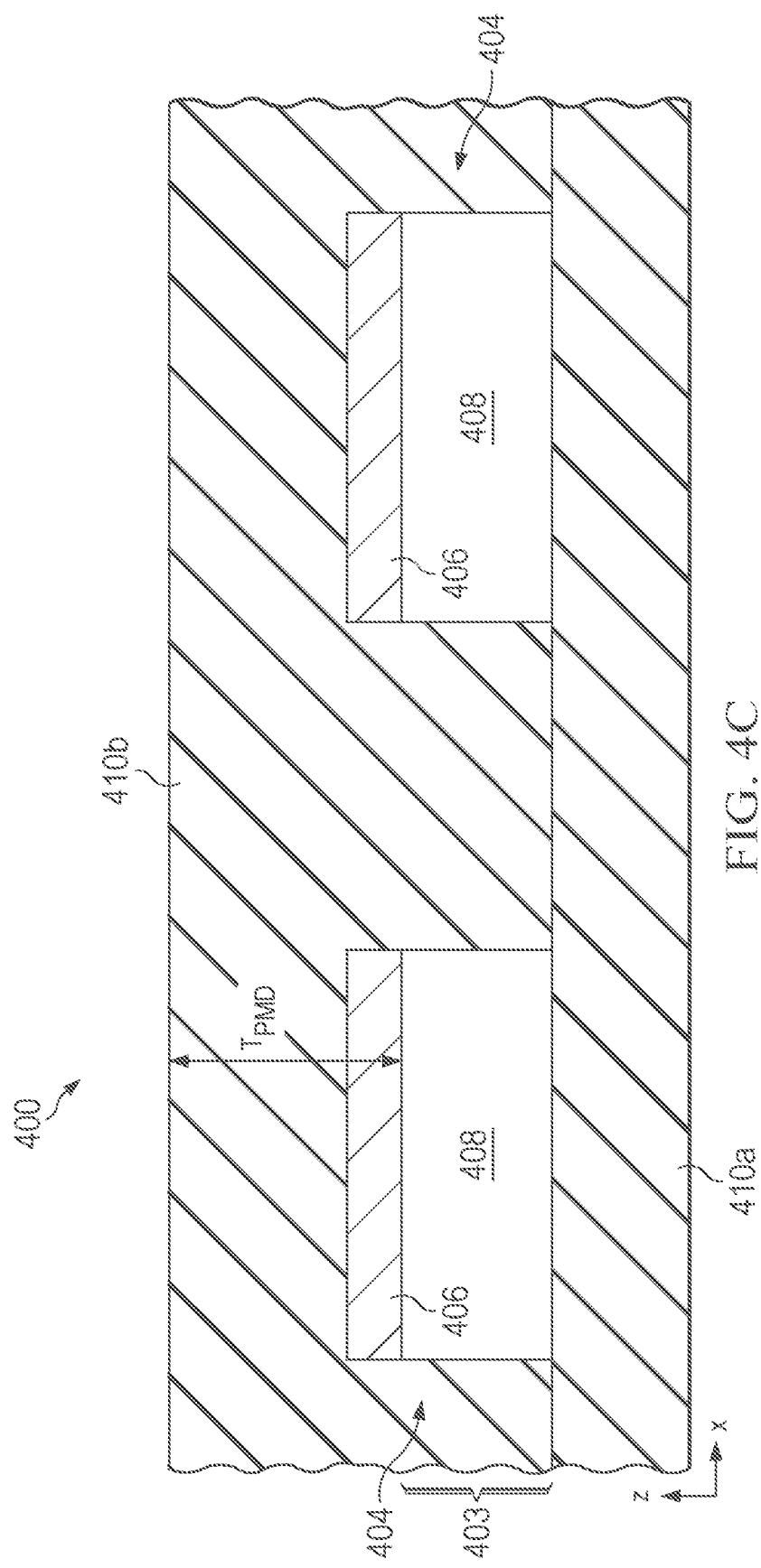
Figure 4D:
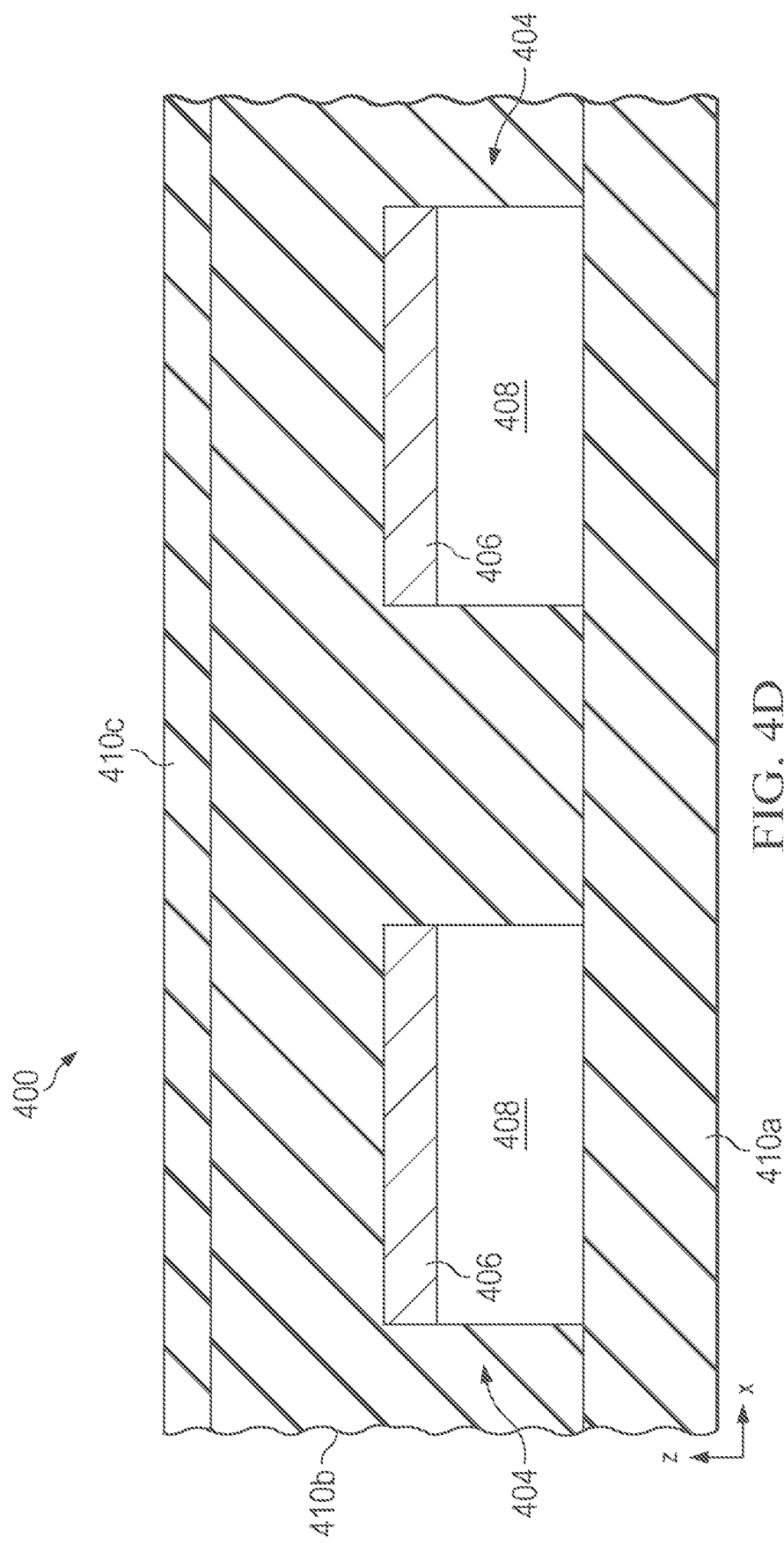
Figure 4E:
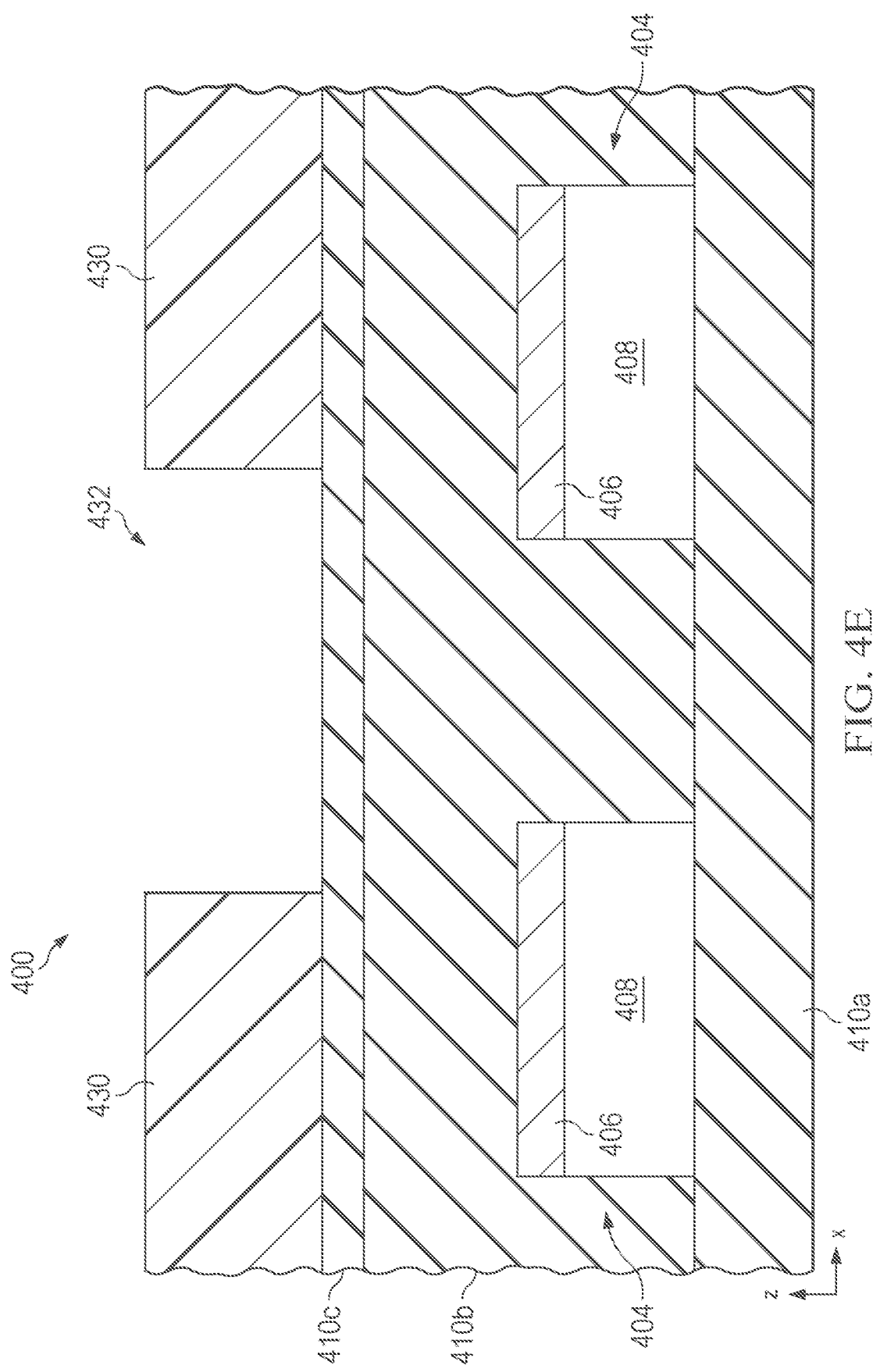
Figure 4F:
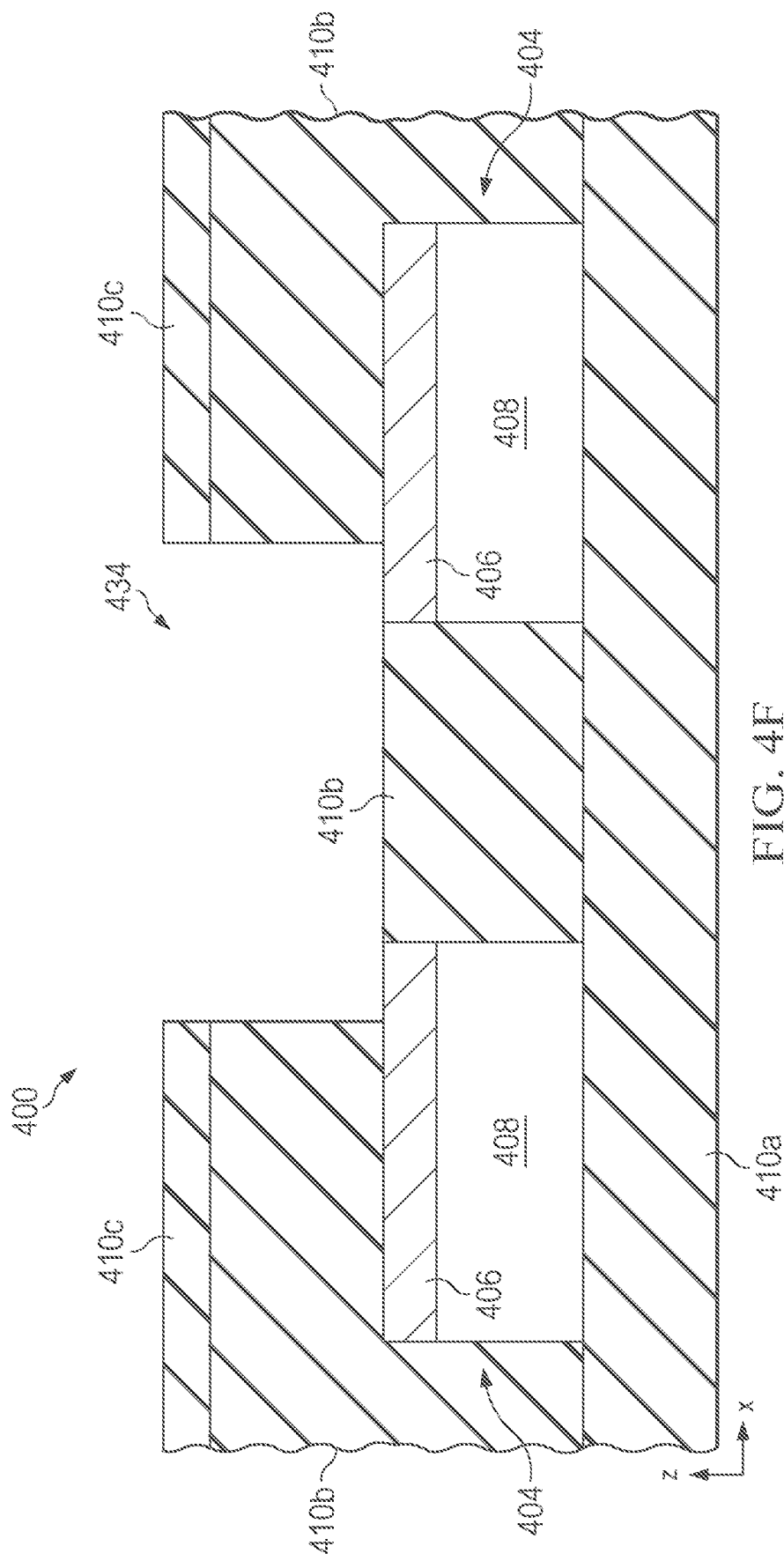
Figure 4G:
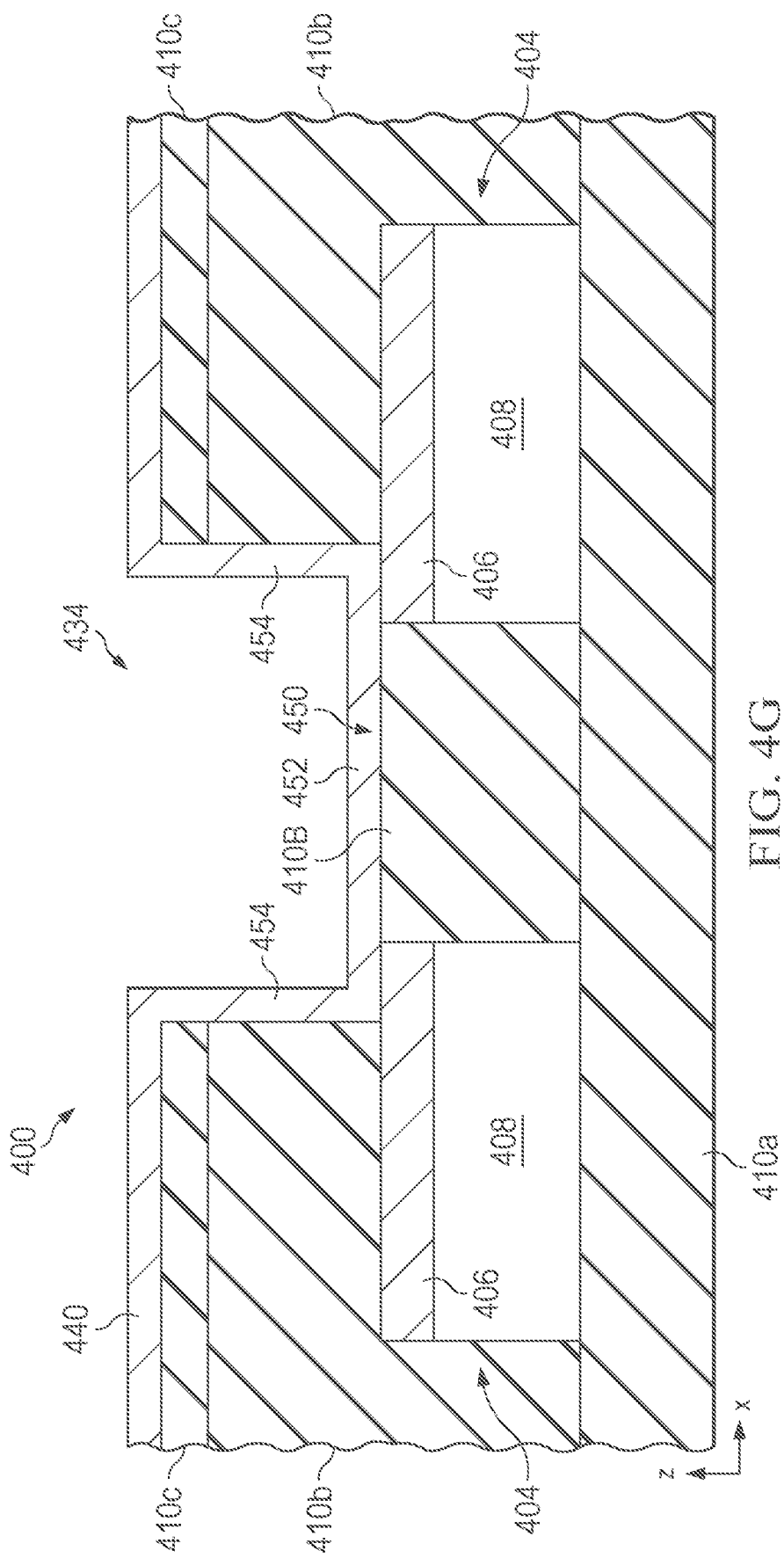
Figure 4I:
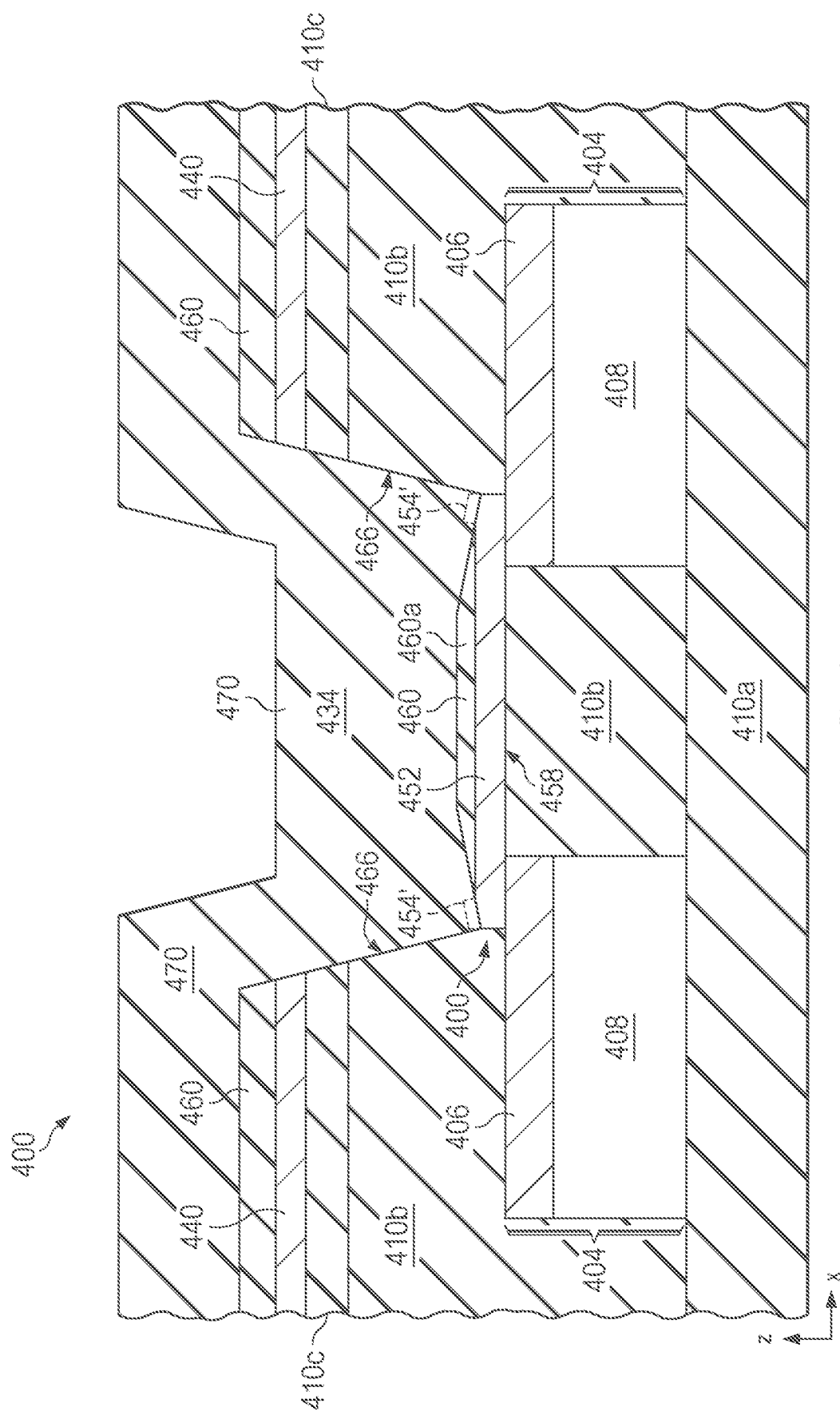
Figure 4J:
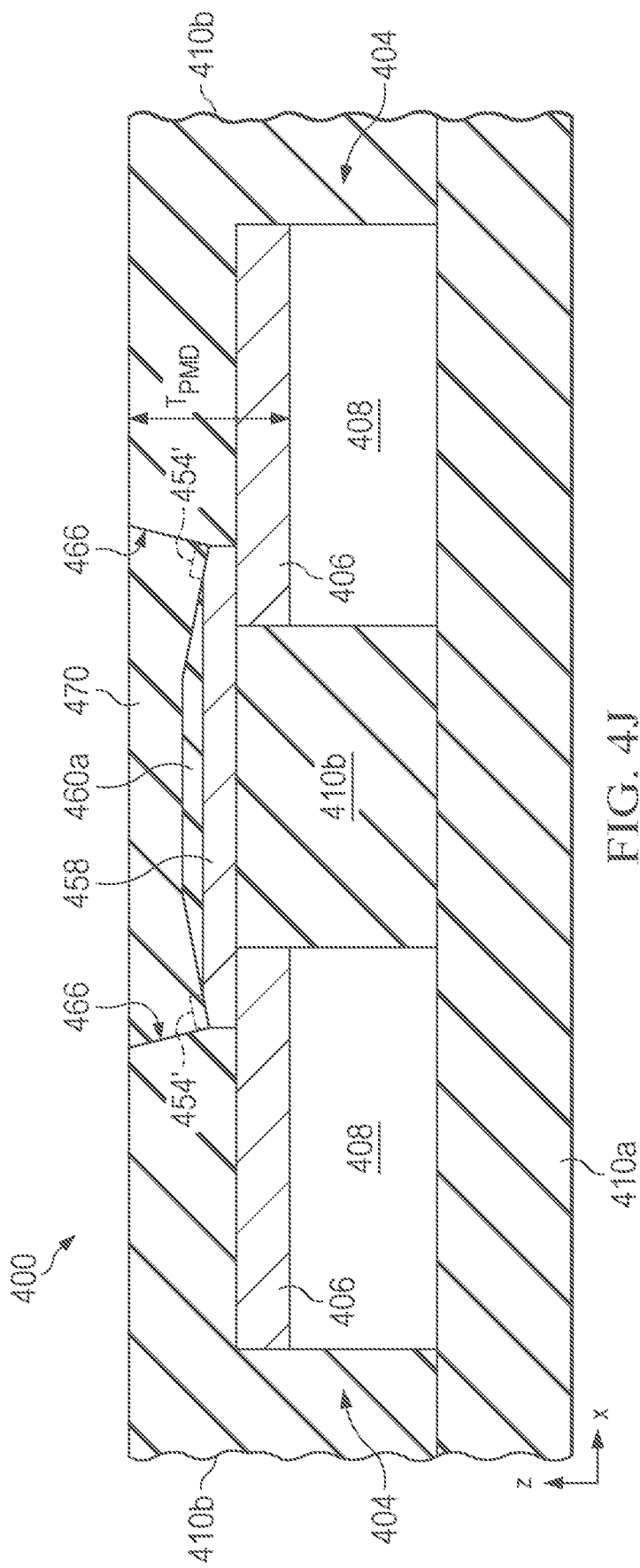
Figure 4K:
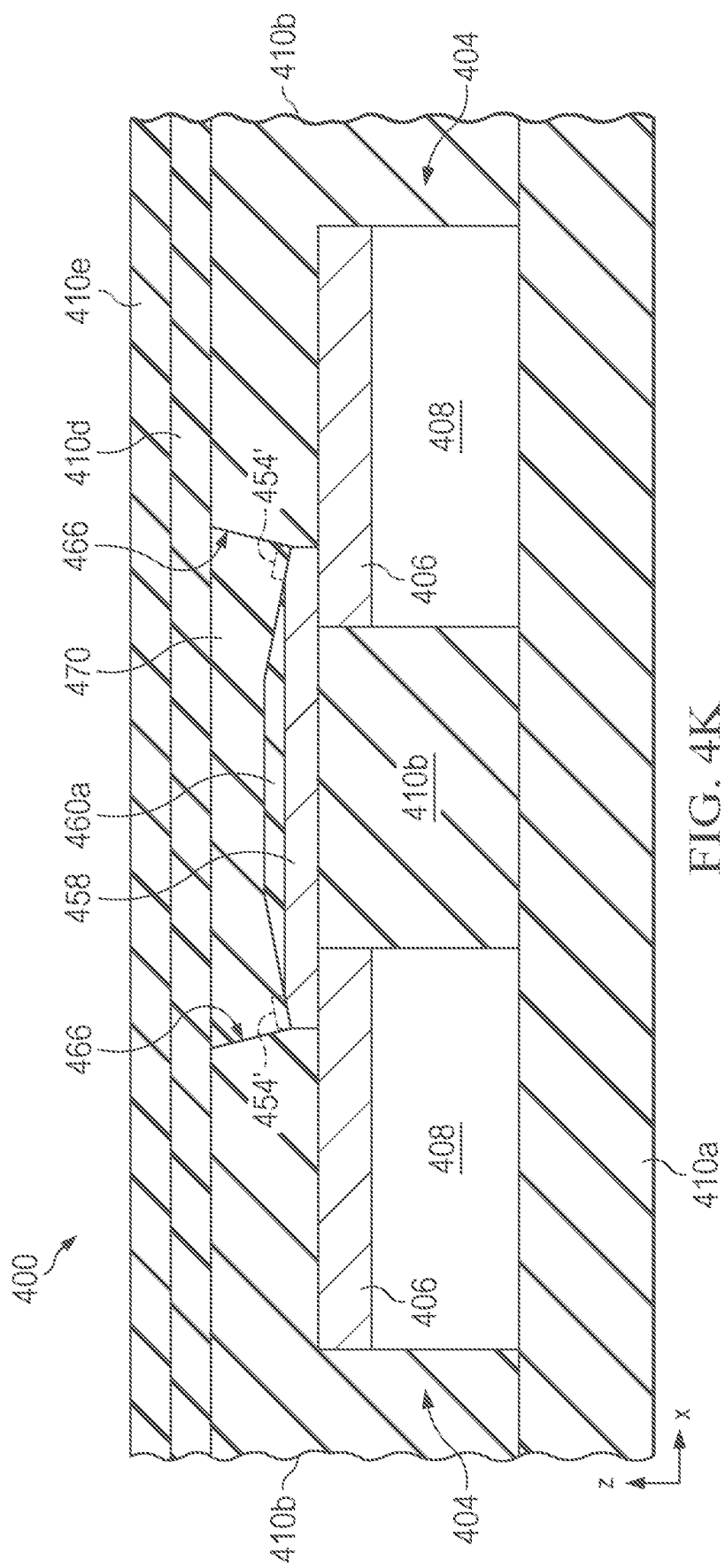
Figure 4L:
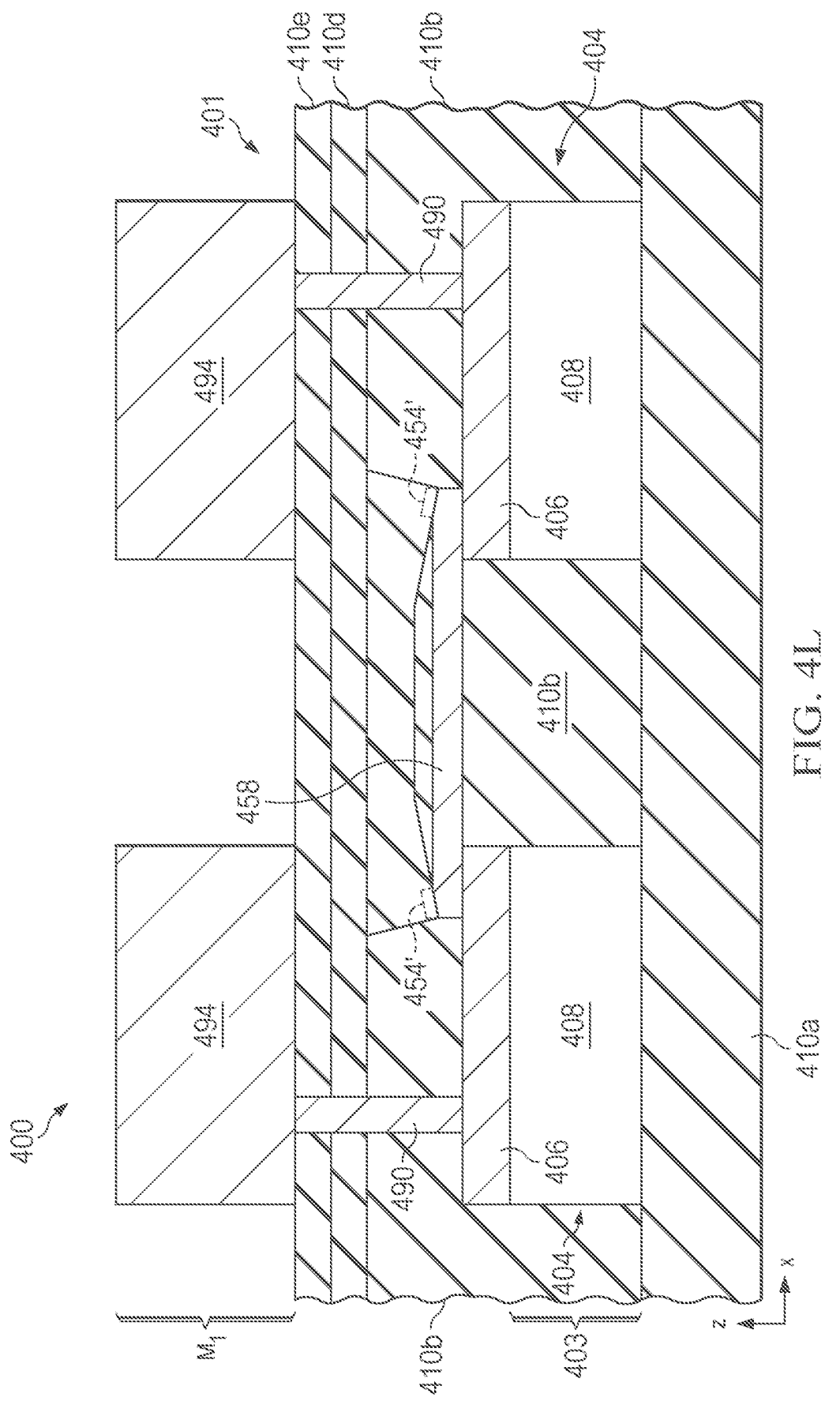

FIGS. 4A-4L illustrate an example process for forming an integrated circuit (IC) structure 400 including an example TFR module 401 having a TFR element 402 with removed or shortened vertical ridges, according to one example. The completed TFR module 401 is shown in FIG. 4L. As discussed below, the TFR element 402 is formed between a polysilicon layer 403 and a first metal interconnect layer M$_1$ (also referred to as a metal-1 layer).

FIG. 4A shows the initial formation of the IC structure 400 including the example TFR module 401 being constructed, by forming a pair of TFR heads 404 over a field oxide region 410a, each TFR head 404 comprising a silicided polysilicon structure including a metal silicide layer 406 formed on a respective polysilicon structure 408. For example, a polysilicon layer 403 is deposited, patterned, and etched to form the pair of polysilicon structures 408, along with other polysilicon structures apart from the TFR module 401, e.g., defining CMOS gate structures. A metal silicide region 406 is then formed on each polysilicon structure 408. Each metal silicide region 406 is self-aligned over the respective polysilicon structure 408; thus TFR heads 404 may be referred to as salicide (self-aligned silicide) TFR heads 404. The salicide TFR heads 404 may comprise any suitable silicon-based chemistry, e.g., CoSi$_2$, NiSi, or TiSi$_2$, for example. In one example, each polysilicon structure 408 has a thickness in the range of 1000-3000 Å, and the metal silicide layer 406 on each polysilicon structure 408 has a thickness in the range of 100-300 Å.

As shown in FIG. 4B, the IC structure 400 may be further processed by depositing a pre-metal dielectric (PMD) region 410b over the structure, e.g., using a high-density plasma (HDP) deposition process. In one example, the PMD region 410b may be formed by depositing silicon rich oxide (SRO) with a thickness of about 1,000 Å, followed by deposition of HDP oxide with a thickness of about 10,000 Å.

As shown in FIG. 4C, a pre-metal dielectric chemical/mechanical planarization (PMD CMP) process is performed on the IC structure 400. In one example embodiment, the PMD CMP process is performed to achieve a target thickness T$_{PMD}$ of about 4,000 Å over polysilicon layer 403.

As shown in FIG. 4D, a sacrificial oxide layer 410c (e.g., having a thickness of about 1,000 Å) is deposited on the IC structure 400, for example using a plasma enhanced chemical vapor deposition (PECVD) process. The sacrificial oxide layer 410c may be subsequently removed (e.g., polished away), as discussed below with respect to FIG. 4J.

As shown in FIG. 4E, a photoresist layer 430 may be deposited and patterned to define a photoresist opening 432 extending laterally over a partial width of each TFR head 404, or in other examples over a full width of one or both TFR heads 404.

As shown in FIG. 4F, an etch is performed through the photoresist opening 432 to define an opening 434 in the underlying sacrificial oxide layer 410c and PMD region 410b. The etch may be selective to stop on the metal silicide layers 406 on TFR heads 404. In some examples the etch process may be controlled to avoid significant overetch into the PMD region 410b. After the etch, remaining photoresist material 430 may be removed, e.g., by performing a resist strip. As shown, the opening 434 exposes a partial portion of a top surface of each metal silicide layer 406.

As shown in FIG. 4G, a TFR layer 440 is deposited over the IC structure 400 and extending down into the opening 434, e.g., using a Physical Vapor Deposition (PVD) or sputter deposition process. In one example, TFR layer 440 comprises a SiCr layer with a thickness in the range of 400 Å-600 Å. In other examples, TFR layer 440 may comprise SiCCr, TaN, NiCr, AlNiCr, TiNiCr, or any other suitable TFR material.

The portion of TFR layer 440 extending down into the opening 434 defines a cup-shaped TFR layer structure 450 including (a) a laterally-extending TFR element base 452 conductively connected to both TFR heads 404 (in this example, TFR element base 452 directly contacts the metal silicide layer 406 on each TFR head 404) and (b) vertical ridges 454 extending upward from the TFR element base 452. For example, the TFR element base 452 may have a rectangular shape when viewed from above (i.e., a rectangular shape in the x-y plane), with four vertical ridges 454 extending upward from the four lateral edges of the rectangular TFR element base 452.

The IC structure 400 including TFR layer 440 may then be annealed, e.g., at a temperature of about 500° C. (e.g., 400° C.-600° C. or 450° C.-550° C.) to achieve 0 ppm or near 0 ppm TCR (temperature coefficient of resistance) of the TFR layer 440. In some examples, "near 0" ppm TCR may include a TCR of 0±100 ppm/° C., or a TCR of 0±50 ppm/° C., or a TCR of 0±20 ppm/° C., or a TCR of 0±10 ppm/° C., depending on the particular example. In addition, in some examples the annealed TFR layer 440 may have a sheet resistance in the range of 500 Ω/square to 1 KΩ/square.

Next, as shown in FIG. 4H, a high density plasma (HDP) ridge removal process may be performed to remove or vertically shorten the vertical ridges 454 to define a TFR element 458. In one example the HDP ridge removal process involves a HDP chemical vapor deposition (HDPCVD) process, which is a particular PECVD process that uses a higher plasma density than a typical PECVD process.

In some examples the HDP ridge removal process may include two component processes: (1) deposition of a cap layer 460 over the TFR element layer 440 (including over the TFR element base 452), and (2) an HDP sputter etch that removes a full or partial height of the vertical ridges 454. These two component processes may be performed together in a common HDP chamber, and may at least partially overlap in time.

In some examples, cap layer 460 may comprise an oxide layer. The deposited cap layer 460 may protect the underlying TFR element base 452 from being removed by the HDP sputter etch. The timing and other operational parameters of the two component processes of the HDP ridge removal process (i.e., deposition of cap layer 460 and HDP sputter etch) may be selected and adjusted over a series of fabrication processes to achieve target performance characteristics, for example a complete elimination or defined shortening (e.g., below a defined height) of the vertical ridges 454, while also protecting the TFR element base 452 from being removed by the HDP sputter etch.

In some examples, the HDP sputter etch removes the full height of each vertical ridge 454, such that the resulting TFR element 458 includes only the laterally-extending TFR element base 452.

In other examples, the HDP sputter etch removes only a partial height of each vertical ridge 454, leaving shortened vertical ridges 454'. In such examples, the resulting TFR element 458 includes the laterally-extending TFR element base 452 and the shortened vertical ridges 454' extending upward from the lateral edges of the TFR element base 452. In some examples, each shortened vertical ridge 454' has a vertical height H$_{SVR}$ less than 200 Å. In some examples, the vertical height H$_{SVR}$ of each shortened vertical ridge 454' is less than 10% of the y-direction width of the horizontally-extending TFR element base 452, less than 1% of the y-direction width of the TFR element base 452, or less than 0.1% of the y-direction width of the horizontally-extending TFR element base 452, depending on the particular process parameters.

In some examples, regardless of whether the vertical ridges 454 are completely or partially removed, a maximum height $H_{TFR}$ of the TFR element 458 is less than 1,000 Å. In some examples, the maximum height $H_{TFR}$ of the TFR element 458 is less than 600 Å.

The HDP ridge removal process may change the shape and size of the opening 434. For example, as shown in FIG. 4H, the sputter etch performed in the HDP ridge removal process widens the opening 434 by removing or shortening the vertical ridges 454 along with portions of the PMD region 410 proximate the vertical ridges 454, resulting in inclined (i.e., non-vertical) sidewalls or "facets" 466 of the remaining PMD region 410 on opposing sides of the opening 434.

Assuming the HDP ridge removal process is performed with a vertical orientation (e.g., vertical oxide deposition and sputter etch directions), the oxide deposition rate (forming the cap layer 460) and the HDP sputter etch rate may vary as a function of the angle of each surface being acted upon (target surface angle) relative to horizontal (represented by the x-y plane in FIG. 4H). As shown in FIG. 4H, this dependence of the HDP ridge removal process orientation on the relevant target surface angle may form (a) a humped region of the cap layer 460 on the TFR element base 452, indicated at 460a and (b) the inclined (i.e., non-vertical) sidewalls 466 extending upwardly and outwardly from the lateral edges of the TFR element base 452.

Next, as shown in FIG. 4I, after the HDP ridge removal process shown in FIG. 4H a bulk fill process is performed to completely fill the opening 434 with a dielectric material 470, e.g., oxide. In some examples, the bulk fill deposition of dielectric material 470 may be performed within the same HDP chamber as the HDP ridge removal process. In other examples, the bulk fill may be performed outside the HDP chamber. The dielectric material 470 (e.g., oxide) deposited in opening 434 may have a different dielectric constant (and/or other material property or properties) than the PMD region 410b laterally outside the opening 434. For example, a dielectric constant of dielectric material 470 may differ from a dielectric constant of PMD region 410b (e.g., comprising SRO) by at least 0.01.

As shown in FIG. 4J, the IC structure 400 may be further processed by performing a CMP process to remove portions of the dielectric material 470, cap layer 460, and TFR layer 440 layer outside the opening 434, as well as the sacrificial oxide layer 410c. In one example, the CMP process is performed to achieve the same target thickness $T_{PMD}$ (e.g., 4,000 Å) as the CMP performed prior to starting the formation of the TFR module 401, i.e., the CMP process discussed above with reference to FIG. 4C. Thus, the TFR module 401 can be formed in a modular manner, at various depths in the IC structure 400, without altering the background process for forming other structures on the wafer.

As shown in FIG. 4K, in one example a phosphosilicate glass (PSG) layer or film 410d is deposited over the PMD region 410b, followed by deposition of an un-doped silicate glass (USG) cap oxide layer 410e. PSG layer 410d and USG cap oxide layer 410e may be deposited as steps of the background CMOS process for forming the IC structure 400, e.g., for forming other structures on the wafer outside the footprint of the TFR module 401 being formed. In one example embodiment, the PSG layer 410d and USG cap oxide layer 410e may each have a deposited thickness of in the range of 1000-3000 Å (e.g., about 2000 Å).

Finally, as shown in FIG. 4L, a pair of vertically-extending TFR contacts 490 (also referred to herein as TFR contacts 490 for convenience) may be formed, with each TFR contact 490 in contact with or otherwise conductively connected with a respective TFR head 404. In some examples, TFR contacts 490 are formed concurrently with CMOS contacts, and may have the same diameter or width as CMOS contacts in the IC structure 400. In one example, TFR contacts 490 are formed by patterning and etching the IC structure 400 to define a pair of openings (e.g., contact openings), filling the openings with a conductive material, e.g., tungsten (W), and performing a CMP process to planarize a top surface of each TFR contact 490 with the top surface of the USG cap oxide layer 410e.

After the CMP process, a pair of upper TFR connection elements 494 may be formed in a first metal interconnect layer $M_1$, also referred to as a metal-1 layer. In such examples, upper TFR connection elements 494 may be formed along with other metal-1 interconnect structures (e.g., interconnect lines or wires) apart from the TFR module 401. Each upper TFR connection element 494 is formed in contact with or otherwise conductively connected with a respective TFR contact 490, such that each upper TFR connection element 494 is conductively connected with a respective TFR head 404.

TFR contacts 490 and upper TFR connection elements 494 may be formed using any suitable process or processes. For example, TFR contacts 490 may be formed by a damascene process, followed by formation of upper TFR connection elements 494 by deposition and selective etching of metal interconnect layer $M_1$. As another example, TFR contacts 490 may be formed by a first damascene process, followed by formation of upper TFR connection elements 494 by a second damascene process. As another example, TFR contacts 490 and upper TFR connection elements 494 may be formed together using a dual damascene process. TFR contacts 490 and upper TFR connection elements 494 may be formed from any suitable metal or metals. For example, TFR contacts 490 may be formed from tungsten, and upper TFR connection elements 494 may be formed from copper or aluminum. As another example, TFR contacts 490 and upper TFR connection elements 494 may be both formed from copper or aluminum, e.g., using a dual damascene process or other suitable process(es).

In this manner, TFR module 401 including TFR element 458 with fully removed vertical ridges 454 or shortened vertical ridges 454' may be formed between a polysilicon layer 403 and first metal interconnect layer $M_1$, using a damascene approach with a single mask layer added to the background IC fabrication process. Further, in some embodiments, the TFR element 458 may formed from SiCr or other suitable material annealed to achieve 0 ppm or near 0 ppm TCR. In addition, the TFR module 401 may be compatible with copper or aluminum interconnect (e.g., where TFR contacts 490 and upper TFR connection elements 494 are each formed from copper or aluminum).

As discussed above, removing or shortening the vertical ridges 454 may improve the TCR characteristics of the resulting TFR element 458, as compared with a TFR element including TFR element ridges that are not removed (e.g., extending up to the top of dielectric region which the TFR element is formed), for example as shown in FIG. 2A.

FIG. 5 provides a graph showing example TCR data for the example TFR module 401 with the TFR element 458 having removed or shortened vertical ridges, e.g., formed according to the process shown in FIGS. 4A-4L. In particular, the graph illustrates TCR as a function of the TFR element width (in the y-axis direction (into the page) shown in FIG. 4L) for multiple instances of TFR element 458 having a common TFR element length in the x-axis direction ($L_{TFR}$) of 100 microns but a different TFR element width ranging from 0.9 to 10 microns. The variation of the TCR value as a function of the TFR element width is substantially less than the TCR variance for similar TFR modules with TFR elements having non-removed (i.e., full-height) TFR element ridges, e.g., as can be seen by comparing the example graph shown in FIG. 5 with the example graph shown in FIG. 2B.

FIGS. 6A-6K illustrate an example process for forming an IC structure 600 including another example TFR module 601 having a TFR element 658 with removed or shortened vertical ridges, according to one example. TFR module 601 is generally similar to TFR module 401 discussed above, but wherein the TFR element 658 is formed between two metal interconnect layers $M_x$ and $M_{x+1}$, rather than between a polysilicon layer and first metal interconnect layer $M_1$.

FIG. 6A shows the initial formation of the IC structure 600 including the example TFR module 601, by forming a pair of metal TFR heads 604 in a lower metal interconnect layer $M_x$ over a first dielectric region 610a, e.g., a first inter-metal dielectric (IMD) region. Lower metal interconnect layer $M_x$ may comprise any metal interconnect layer at any depth in the IC structure 600, e.g., a metal-1 layer ($M_1$), a metal-2 layer ($M_2$), without limitation. Lower metal interconnect layer $M_x$ may comprise aluminum, copper, or suitable metal, and may include various interconnect structures, e.g., metal lines or wires, in addition to the pair of TFR heads 604. Such interconnect structures and TFR heads 604 may be formed by deposition and etching of a metal layer, or by a damascene process, for example.

Figure 6B:
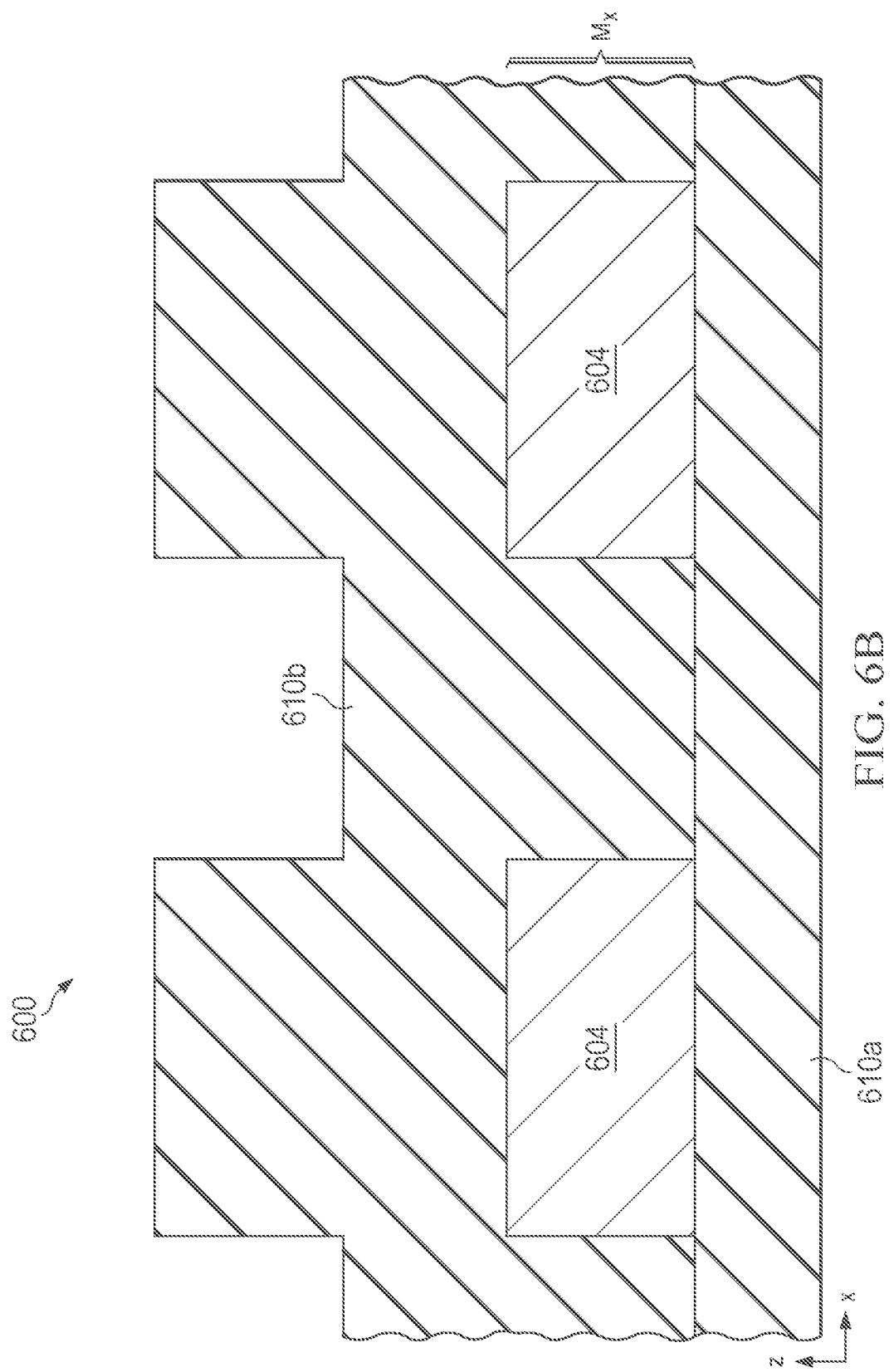
Figure 6C:
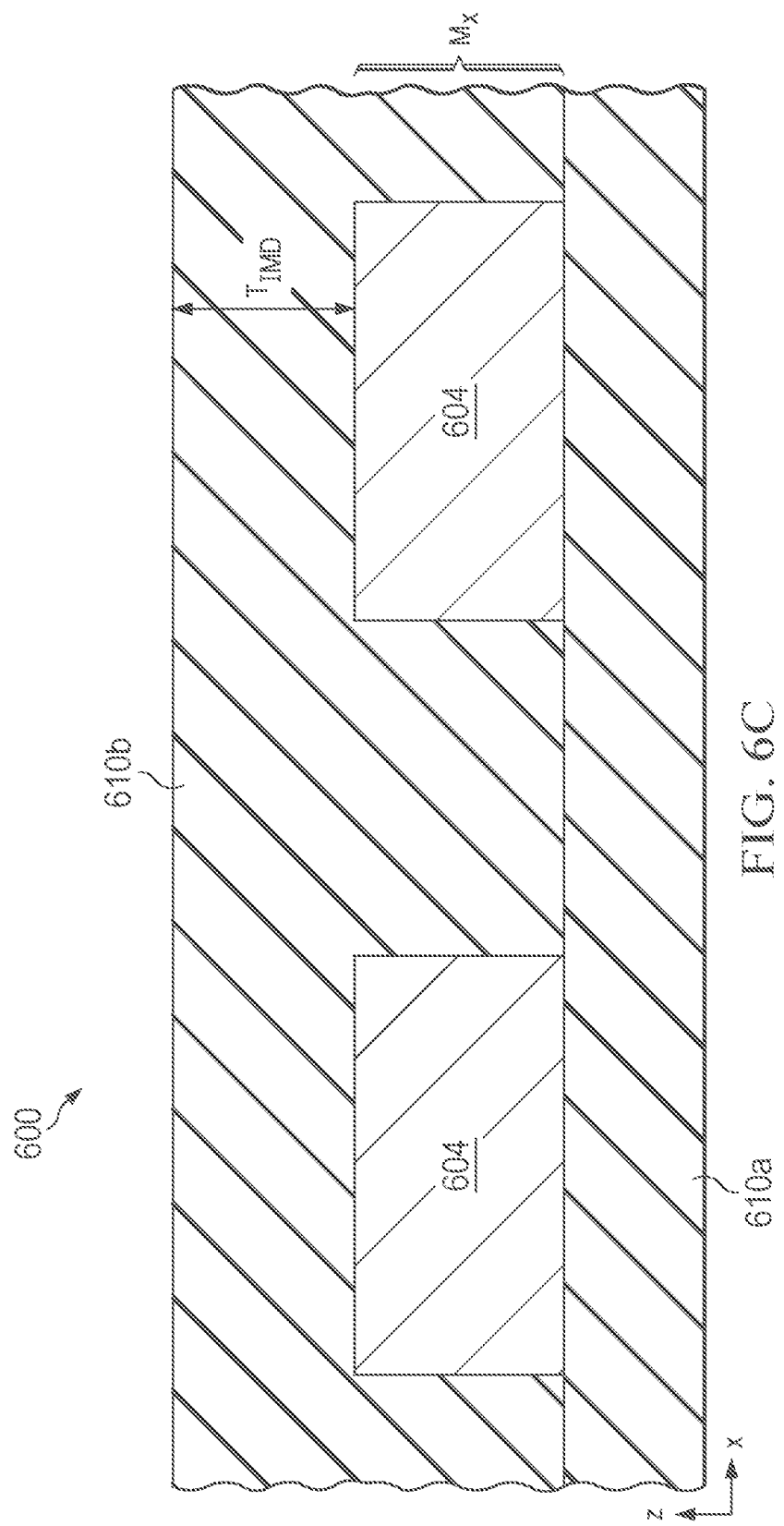

As shown in FIG. 6B, a second dielectric region 610b, e.g., a second IMD region, is deposited over the lower metal interconnect layer $M_x$ including TFR heads 604. As shown in FIG. 6C, an inter-metal dielectric CMP (IMD CMP) process may be performed to reduce the second IMD region 610b to a target thickness $T_{IMD}$ of about 6,000 Å over the lower metal interconnect layer $M_x$.

Figure 6D:
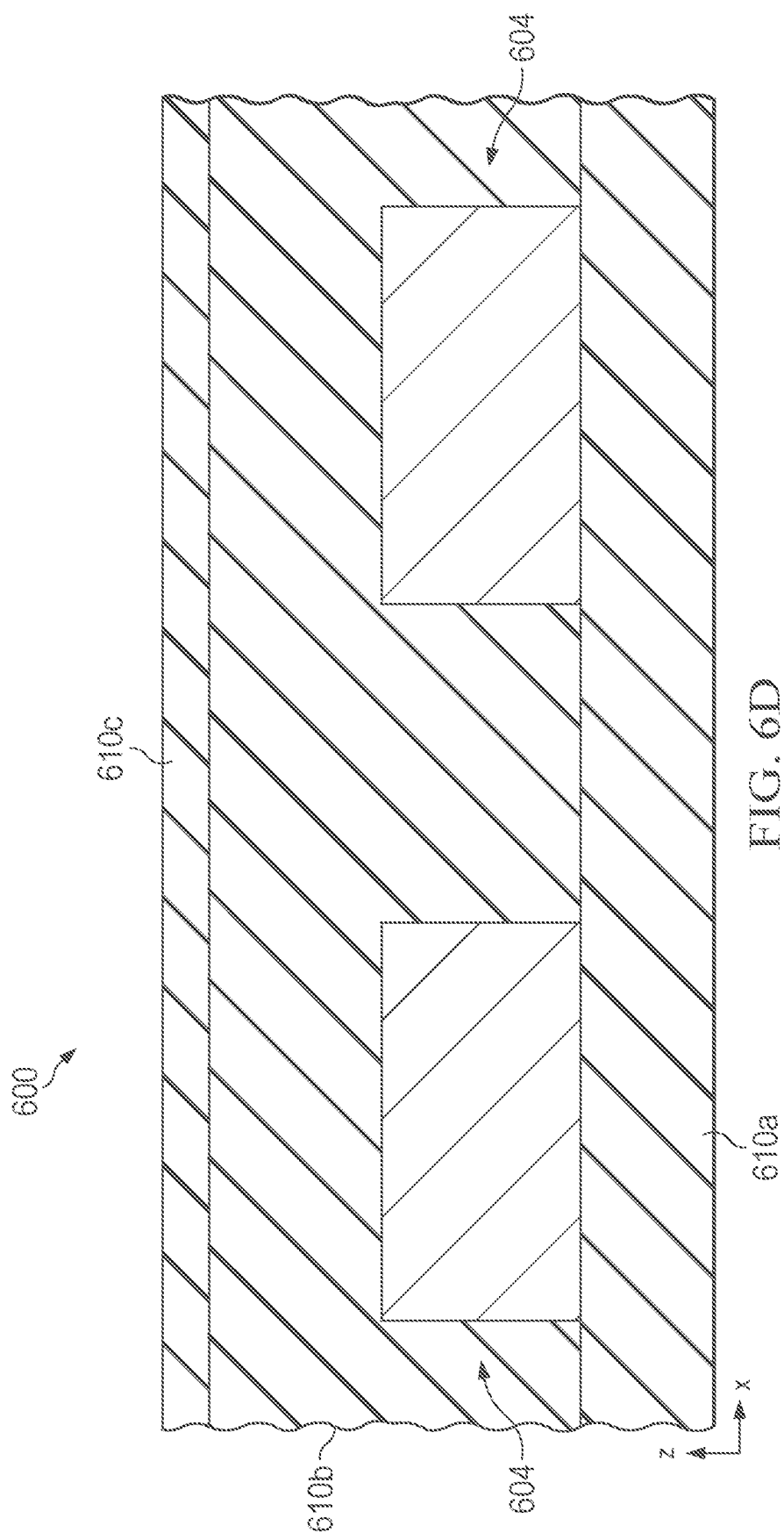

Next, as shown in FIG. 6D, a layer of sacrificial oxide 610c (e.g., having a thickness of about 1000 Å) may be deposited on the IC structure 600, for example using a plasma enhanced chemical vapor deposition (PECVD) process. The sacrificial oxide 610c may be subsequently polished away, as discussed below with respect to FIG. 6J.

Figure 6E:
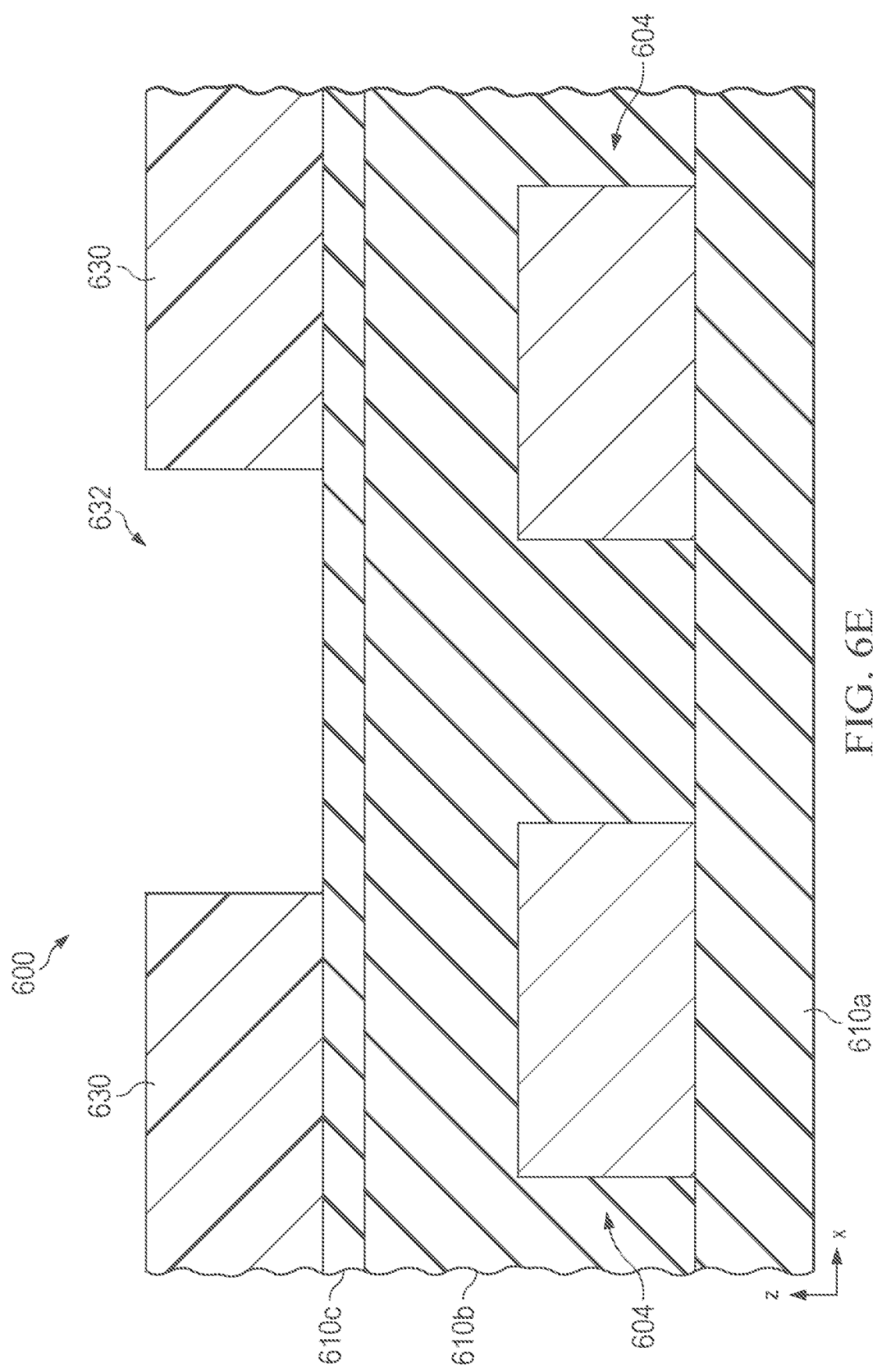
Figure 6F:
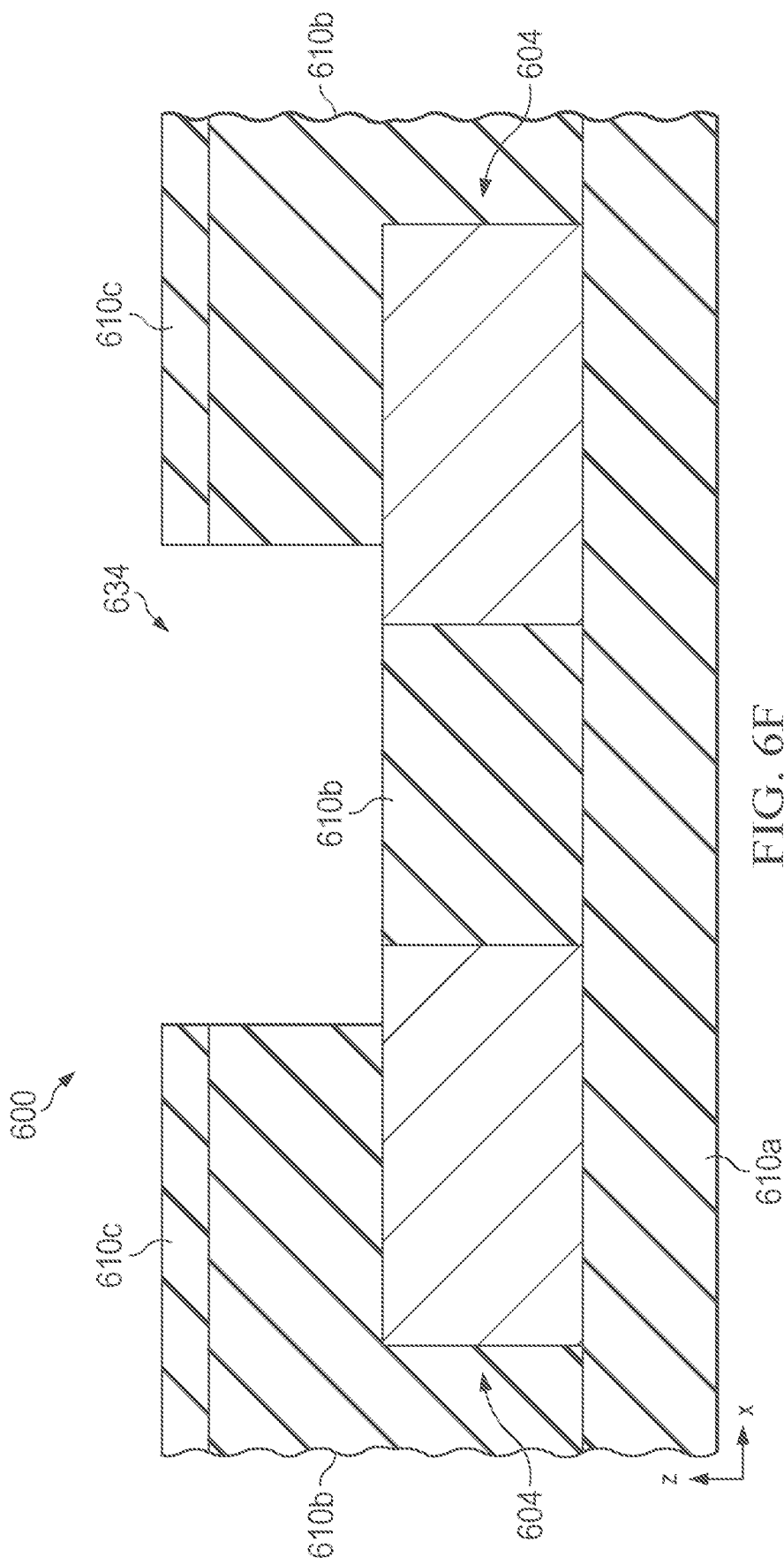

Next, as shown in FIG. 6E, a photoresist layer 630 may be deposited and patterned to define a photoresist opening 632 extending laterally at least partially over both TFR heads 604. As shown in FIG. 6F, an etch is performed through the photoresist opening 632 to define a TFR opening 634 in the underlying sacrificial oxide layer 610c and IMD region 610b, using any suitable etch process, which may stop on the metal TFR heads 604 and which may be controlled to avoid significant overetch into the IMD region 610b. After the etch, remaining photoresist material 630 may be removed, e.g., by performing a resist strip.

Figure 6G:
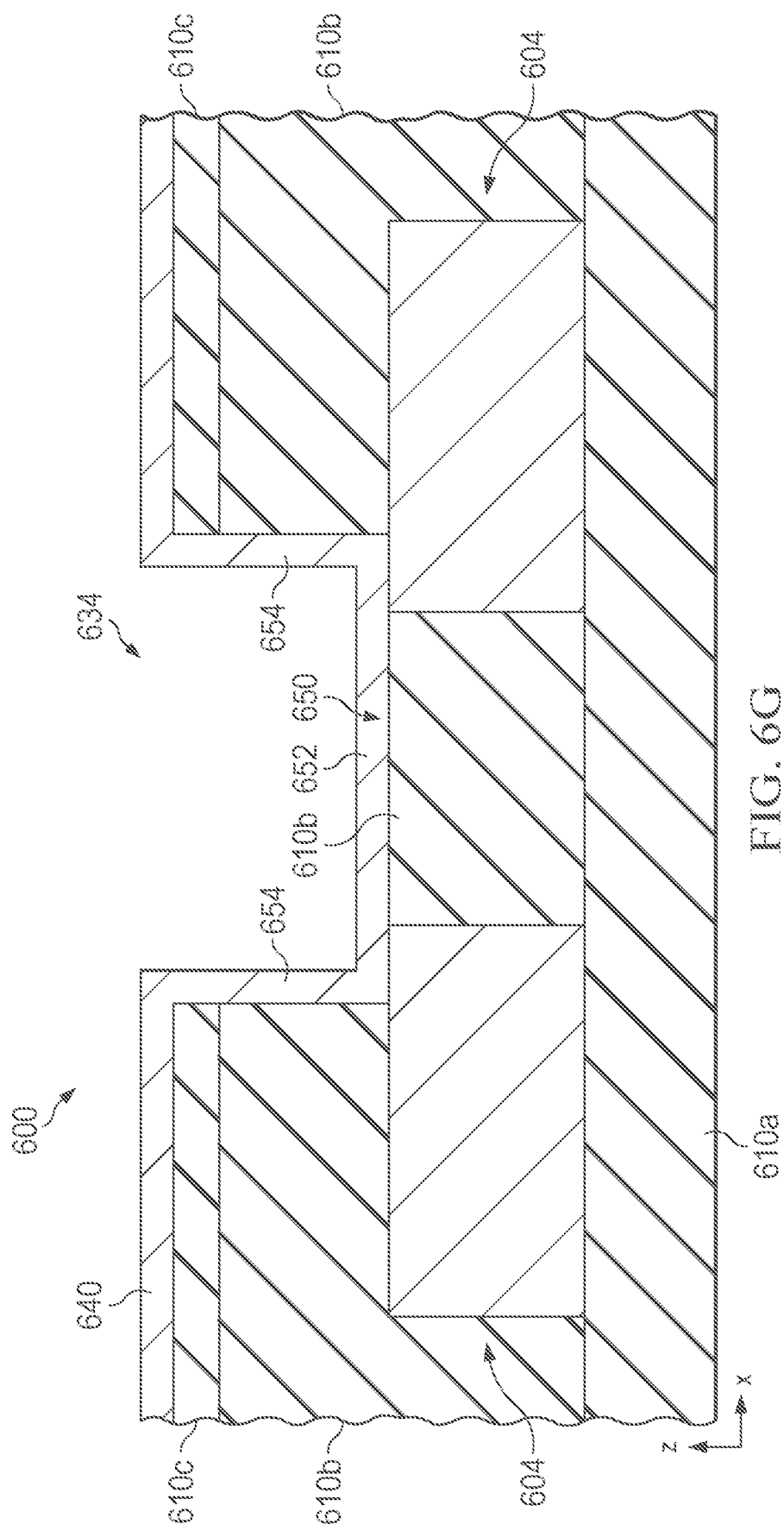

As shown in FIG. 6G, a TFR layer 640 is deposited over the IC structure 600 and extending down into the TFR opening 634, e.g., using a PVD or sputter deposition process. As discussed above with respect to the example shown in FIG. 4G, it may be advantageous to anneal the TFR layer 640 to improve the TCR characteristics of the TFR layer 640. However, unlike the polysilicon layer 403 in which the TFR heads 404 of the example TFR module 401 discussed above 4L are constructed, the lower metal interconnect layer $M_x$ in which metal TFR heads 604 of TFR module 601 are formed may not effectively tolerate a high-temperature anneal (e.g., above 400° C.) for improving the TCR characteristics of the TFR layer 640. Thus, in some examples, TFR layer 640 may be formed from a material having suitable or target TCR characteristics without being annealed. For example, TFR layer 640 may comprise a SiCCr layer with a thickness of about 100 Å (e.g., in the range of 50-200 Å). Alternatively, TFR layer 640 may comprise SiCr, TaN, NiCr, AlNiCr, TiNiCr, or any other suitable TFR material.

The portion of TFR layer 640 extending down into the TFR opening 634 defines a cup-shaped TFR layer structure 650 including (a) a laterally-extending TFR element base 652 conductively connected to both TFR heads 604 (in this example, TFR element base 652 directly contacts each TFR head 604) and (b) vertical ridges 654 (also referred to more simply as vertical ridges 654) extending upward from the TFR element base 652. For example, the TFR element base 652 may have a rectangular shape when viewed from above (i.e., a rectangular shape in the x-y plane), with four vertical ridges 654 extending upward from the four lateral edges of the rectangular TFR element base 652.

Figure 6H:
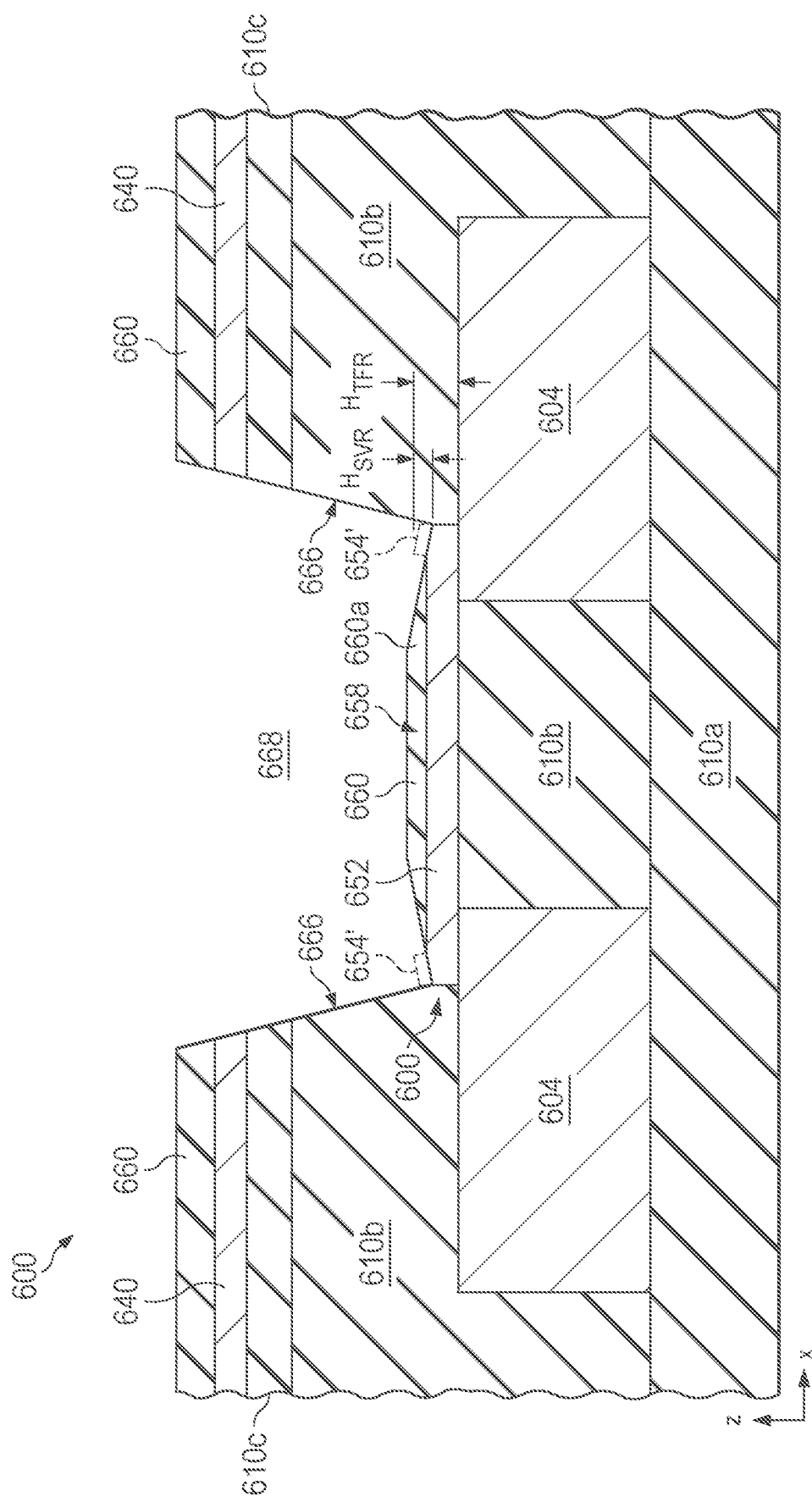

Next, as shown in FIG. 6H, a high density plasma (HDP) ridge removal process may be performed to remove or vertically shorten the vertical ridges 654 to define a TFR element 658. In one example the HDP ridge removal process involves a HDP chemical vapor deposition (HDPCVD) process.

The HDP ridge removal process may include two component processes: (1) deposition of a cap layer 660 over the TFR element layer 640 (including over the TFR element base 652), and (2) an HDP sputter etch that removes a full or partial height of the vertical ridges 654. These two component processes may be performed together in a common HDP chamber, and may at least partially overlap in time.

In some examples, the cap layer 660 may comprise silicon oxide, silicon nitride, or a combination thereof. The deposited cap layer 660 may protect the underlying TFR element base 652 from being removed by the HDP sputter etch. The timing and other operational parameters of the two component processes of the HDP ridge removal process (i.e., deposition of cap layer 660 and HDP sputter etch) may be selected and adjusted over a series of fabrication processes to achieve target performance characteristics, for example a complete elimination or defined shortening (e.g., below a defined height) of the vertical ridges 654, while also protecting the TFR element base 652 from being removed by the HDP sputter etch.

In some examples, the HDP sputter etch removes the full height of each vertical ridge 654, such that the resulting TFR element 658 includes only the laterally-extending TFR element base 652.

In other examples, the HDP sputter etch removes only a partial height of each vertical ridge 654, leaving shortened vertical ridges 654'. In such examples, the resulting TFR element 658 includes the laterally-extending TFR element base 652 and the shortened vertical ridges 654' extending upward from the lateral edges of the TFR element base 652. In some examples, each shortened vertical ridge 654' has a vertical height $H_{SVR}$ less than 200 Å. In some examples, the vertical height $H_{SVR}$ of each shortened vertical ridge 654' is less than 10% of the y-direction width of the horizontally-extending TFR element base 652, less than 1% of the y-direction width of the TFR element base 652, or less than 0.1% of the y-direction width of the horizontally-extending TFR element base 652, depending on the particular process parameters.

In some examples, regardless of whether the vertical ridges 654 are completely or partially removed, a maximum height $H_{TFR}$ of the TFR element 658 is less than 1,000 Å. In some examples, the maximum height $H_{TFR}$ of the TFR element 658 is less than 600 Å.

As discussed above with reference to FIG. 4H, the cap layer deposition rate (forming the cap layer 660) and the HDP sputter etch rate may vary as a function of the angle of each surface being acted upon (target surface angle) relative to horizontal, which may result in the formation of (a) a humped region of the cap layer 660 on the TFR element base 652, indicated at 660a, (b) inclined (i.e., non-vertical) sidewalls or "facets" 666 extending upwardly and outwardly from the lateral edges of the TFR element base 652, and (c) an opening 668 above the humped cap region 660a and between the inclined sidewalls 666.

Figure 6I:
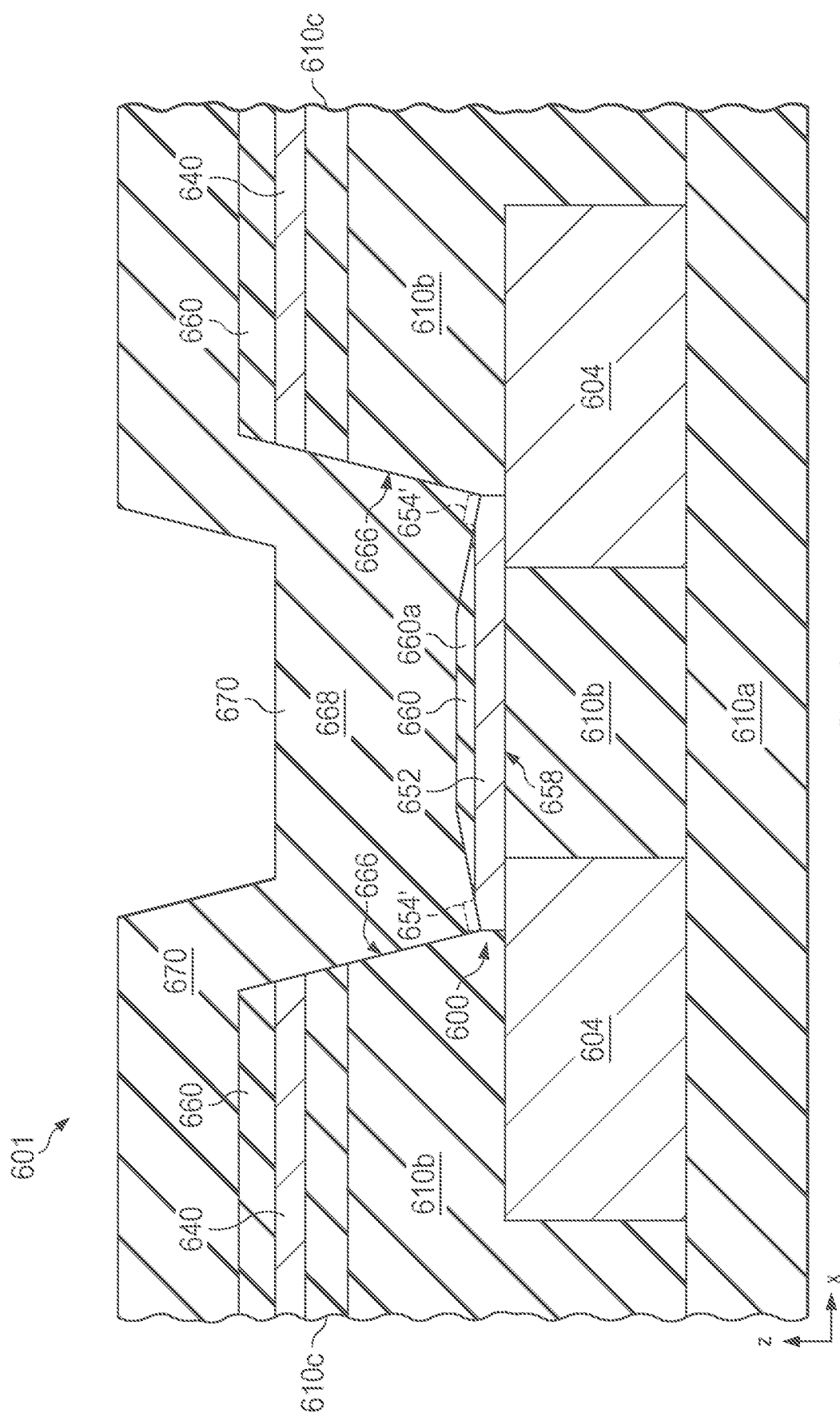

Next, as shown in FIG. 6I, after the HDP ridge removal process discussed above, a bulk fill process is performed. In particular, a dielectric material 670 (e.g., an oxide or nitride) may be deposited on the IC structure 600 to completely fill the opening 668. This bulk fill deposition of dielectric material 670 may be performed within the HDP chamber of the HDP ridge removal process, or outside the HDP chamber, depending on the particular implementation. The dielectric material 670 (e.g., oxide or nitride) deposited in opening 668 may have a different dielectric constant (and/or other material property or properties) than the IMD region 610b laterally outside the opening 668. For example, a dielectric constant of dielectric material 670 may differ from a dielectric constant of IMD region 610b (e.g., comprising oxide) by at least 0.1 or at least 1.0. For instance, in one example dielectric material 670 may comprise a nitride having a dielectric constant of about 7.0 while IMD region 610b may comprise oxide having a dielectric constant of about 3.9.

Figure 6J:
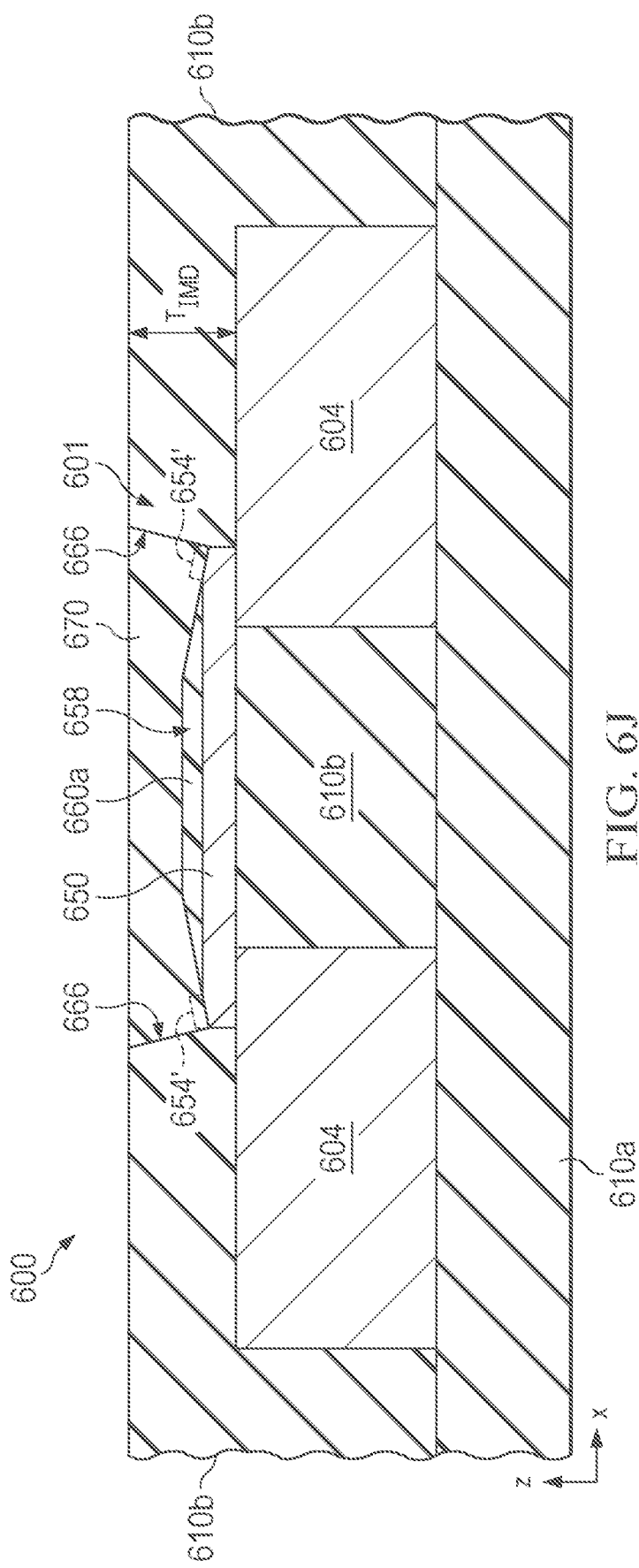

As shown in FIG. 6J, the IC structure 600 may be further processed by performing a CMP process to remove portions of the dielectric material 670, cap layer 660, and TFR layer 640 layer outside the opening 668, as well as the sacrificial oxide layer 610c. In one example, the CMP process is performed to achieve the same target thickness $T_{IMD}$ (e.g., 6,000 Å) as the CMP performed prior to starting the formation of the TFR module 601, i.e., the CMP process discussed above with reference to FIG. 6C. Thus, the TFR module 601 can be formed in a modular manner, at various depths in the IC structure 600, without altering the background process for forming other structures on the wafer.

Figure 6K:
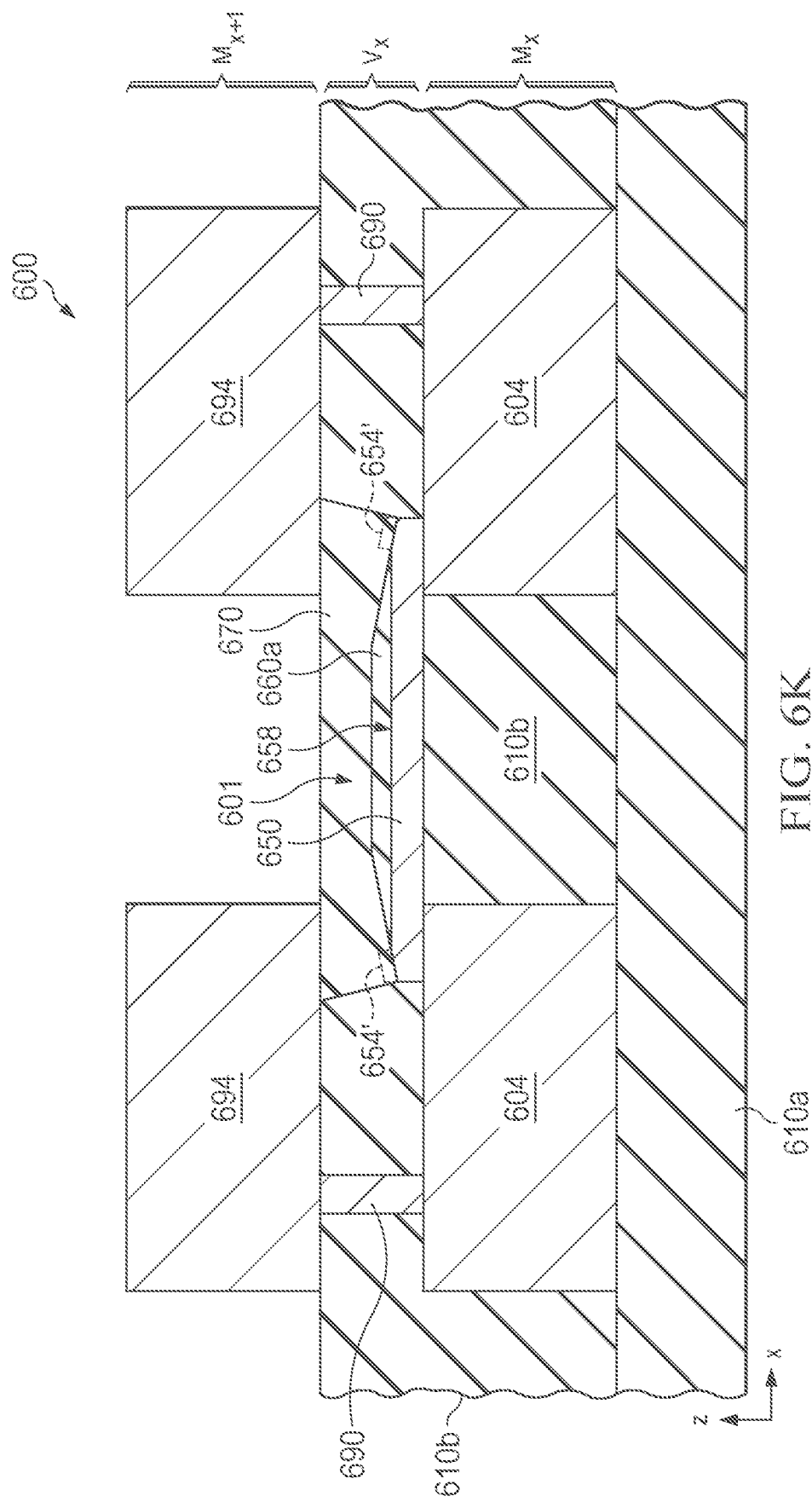

Finally, as shown in FIG. 6K, a pair of vertically-extending TFR contacts 690 (also referred to herein as TFR contacts 690 for convenience) may be formed, with each TFR contact 690 in contact with or otherwise conductively connected with a respective TFR head 604. In some examples, TFR contacts 690 are formed similar to interconnect vias (and may be formed simultaneous with interconnect vias distinct from TFR module 601), and may have the same diameter or width as interconnect vias in the IC structure 600. Thus, TFR contacts 690 may also be referred to as TFR vias, as they may be formed as vias between metal interconnect layers $M_x$ and $M_{x+1}$.

In one example, TFR contacts 690 are formed by patterning and etching the IC structure 600 to define a pair of openings (e.g., via openings), filling the openings with a conductive material, e.g., tungsten (W), and performing a CMP process to planarize a top surface of each TFR contact 690.

After the CMP process, a pair of upper TFR connection elements 694 may be formed in an upper metal interconnect layer $M_{x+1}$, along with additional metal interconnect structures (e.g., interconnect lines or wires) apart from the TFR module 601. Each upper TFR connection element 694 is formed in contact with or otherwise conductively connected with a respective TFR contact 690, such that each upper TFR connection element 694 is conductively connected with a respective TFR head 604.

TFR contacts 690 and upper TFR connection elements 694 may be formed using any suitable process or processes. For example, TFR contacts 690 may be formed by a damascene process, followed by formation of upper TFR connection elements 694 by deposition and selective etching of upper metal interconnect layer $M_{x+1}$. As another example, TFR contacts 690 may be formed by a first damascene process, followed by formation of upper TFR connection elements 694 by a second damascene process. As another example, TFR contacts 690 and upper TFR connection elements 694 may be formed together using a dual damascene process. TFR contacts 690 and upper TFR connection elements 694 may be formed from any suitable metal or metals. For example, TFR contacts 690 may be formed from tungsten, and upper TFR connection elements 694 may be formed from copper or aluminum. As another example, TFR contacts 690 and upper TFR connection elements 694 may be both formed from copper or aluminum, e.g., using a dual damascene process or other suitable process(es).

In this manner, TFR module 601 including TFR element 658 with fully removed vertical ridges 654 or shortened vertical ridges 654' may be formed between two metal interconnect layers $M_x$ and $M_{x+1}$, using a damascene approach with a single mask layer added to the background IC fabrication process. Further, in some embodiments, the TFR element 658 may formed from SiCCr or other suitable material annealed to achieve 0 ppm or near 0 ppm TCR. In addition, the TFR module 601 may be compatible with copper or aluminum interconnect (e.g., where TFR contacts 690 and upper TFR connection elements 694 are each formed from copper or aluminum).

As discussed above, removing or shortening the vertical ridges 654 may improve the TCR characteristics of the resulting TFR element 658, as compared with a TFR element including TFR element ridges that are not removed (e.g., extending up to the top of dielectric region which the TFR element is formed), for example as shown in FIG. 2A.

The invention claimed is:

1. A method for manufacturing a thin film resistor (TFR) module, the method comprising:
    forming a pair of heads spaced apart from each other;
    depositing a dielectric region over the pair of heads;
    forming an opening in the dielectric region, the opening extending over at least a partial width of each head of the pair of heads;
    depositing a TFR layer over the dielectric region and extending into the opening to define a cup-shaped TFR layer structure including (a) a laterally-extending TFR element base conductively connected to both heads and (b) vertical ridges extending upwardly from the laterally-extending TFR element base; and
    performing a high density plasma ridge removal process to remove or shorten the vertical ridges from the cup-shaped TFR layer structure, thereby defining a TFR element having removed or shorted vertical ridges, wherein a high density plasma sputter etch forms inclined sidewalls on opposing sides of the opening.

2. The method of claim 1, wherein forming the opening includes:
    depositing a photoresist layer;

patterning a photoresist opening in the photoresist layer, the patterned photoresist opening extending laterally over at least a portion of each head of the pair of heads; and etching through the patterned photoresist opening to form the opening in the dielectric region.

3. The method of claim 1, wherein the high density plasma ridge removal process includes:
depositing a cap layer on the laterally-extending TFR element; and
performing a high density plasma sputter etch that to remove or shorten the vertical ridges.

4. The method of claim 3, comprising after the high density plasma sputter etch, filling the opening with an oxide material.

5. The method of claim 3, wherein the cap layer comprises silicon oxide.

6. The method of claim 3, wherein the cap layer comprises silicon nitride.

7. The method of claim 3, wherein the high density plasma sputter etch removes a full height of the vertical ridges.

8. The method of claim 1, wherein each of the pair of heads comprises a polysilicon structure having a silicide layer formed thereon.

9. The method of claim 1, wherein each of the pair of heads comprises a metal structure formed in a metal interconnect layer.

10. The method of claim 1, wherein the TFR layer comprises SiCr or SiCCr.

11. The method of claim 1, comprising performing an anneal after depositing the TFR layer but before performing the high density plasma ridge removal process, wherein the anneal at a selected temperature and duration so as to alter a temperature coefficient of resistance (TCR) of the TFR layer.

12. The method of claim 11, comprising performing an anneal to achieve a TCR of the TFR layer of TCR of 0±50 ppm/° C.

13. The method of claim 11, comprising performing an anneal to achieve a TCR of the TFR layer of TCR of 0±10 ppm/° C.

14. The method of claim 11, comprising performing the anneal at a temperature in the range of 450° C. to 550° C.

15. The method of claim 1, comprising performing a chemical mechanical polishing process to remove portions of the TFR layer outside the opening.

16. The method of claim 15, comprising, after the chemical mechanical polishing process, forming at least one of a phosphosilicate glass layer or an un-doped silicate glass cap oxide layer.

17. The method of claim 1, comprising:
forming a pair of vertically-extending contacts, each conductively connected with a respective one of the pair of heads; and
forming a pair of upper connection elements, wherein each upper connection element is conductively connected with a respective one of the vertically-extending contacts.

18. A thin film resistor (TFR) module formed by a method comprising:
forming a pair of heads spaced apart from each other;
depositing a dielectric region over the pair of heads;
forming an opening in the dielectric region, the opening extending over at least a partial width of each head of the pair of heads;

depositing a TFR layer over the dielectric region and extending into the opening to define a cup-shaped TFR layer structure including (a) a laterally-extending TFR element base conductively connected to both heads and (b) vertical ridges extending upward from the laterally-extending TFR element base; and performing a high density plasma ridge removal process to remove or shorten the vertical ridges, wherein a high density plasma sputter etch forms inclined sidewalls on opposing sides of the opening.

19. A thin film resistor (TFR) module, comprising:
a pair of spaced-apart heads;
a TFR element including a laterally-extending TFR element base conductively connected to both heads to thereby define a conductive connection between the spaced-apart heads;
a first dielectric region above the pair of heads;
the first dielectric region having a pair of inclined sidewalls extending upwardly from respective edges of the TFR element; and
a second dielectric region between the pair of inclined sidewalls of the first dielectric region;
wherein the second dielectric region has at least one different material property than the first dielectric region.

20. The TFR of claim 19, wherein a maximum height of the TFR element is less than 1,000 Å.

21. The TFR of claim 19, wherein the TFR element is free from ridges extending vertically from the laterally-extending TFR element base.

22. The TFR of claim 19, wherein the TFR element includes vertical ridges extending upwardly from the laterally-extending TFR element base, each vertical ridge having a vertical height of less than 200 Å.

23. The TFR of claim 19, wherein:
the pair of spaced-apart heads are spaced apart from each other in a first lateral direction;
the TFR element has a lateral width in a second lateral direction perpendicular to the first lateral direction; and
the TFR element includes vertical ridges extending upwardly from the laterally-extending TFR element base, each vertical ridge having a vertical height of less than 10% of the lateral width of the TFR element.

24. The TFR of claim 19, wherein each of the heads comprises a polysilicon structure having a silicide layer formed thereon.

25. The TFR of claim 19, wherein each of the heads comprises a metal structure formed in a metal interconnect layer.

26. A method for manufacturing a thin film resistor (TFR) module, the method comprising:
forming a pair of heads spaced apart from each other;
depositing a dielectric region over the pair of heads;
forming an opening in the dielectric region, the opening extending over at least a partial width of each head of the pair of heads;
depositing a TFR layer over the dielectric region and extending into the opening to define a cup-shaped TFR layer structure including (a) a laterally-extending TFR element base conductively connected to both heads and (b) vertical ridges extending upwardly from the laterally-extending TFR element base; and
performing a high density plasma ridge removal process to remove a full height of the vertical ridges from the cup-shaped TFR layer structure, thereby defining a TFR element having removed or shorted vertical ridges.

27. The method of claim 26, wherein the high density plasma ridge removal process includes:
- depositing a cap layer on the laterally-extending TFR element; and
- performing a high density plasma sputter etch that removes the full height of the vertical ridges from the cup-shaped TFR layer structure.

28. A method for manufacturing a thin film resistor (TFR) module, the method comprising:
- forming a pair of heads spaced apart from each other;
- depositing a first dielectric region over the pair of heads;
- forming an opening in the first dielectric region, the opening extending over at least a partial width of each head of the pair of heads;
- depositing a TFR layer over the dielectric region and extending into the opening to define a cup-shaped TFR layer structure including (a) a laterally-extending TFR element base conductively connected to both heads and (b) vertical ridges extending upwardly from the laterally-extending TFR element base;
- performing a high density plasma ridge removal process to remove or shorten the vertical ridges from the cup-shaped TFR layer structure, thereby defining a TFR element having removed or shorted vertical ridges, the high density plasma ridge removal process expanding the opening in the first dielectric region; and
- filling the expanded opening in the first dielectric region with a second dielectric region, wherein the second dielectric region has at least one different material property than the first dielectric region.

\* \* \* \* \*

UNITED STATES PATENT AND TRADEMARK OFFICE
CERTIFICATE OF CORRECTION

| | |
|---|---|
| PATENT NO. | : 11,670,439 B2 |
| APPLICATION NO. | : 17/499594 |
| DATED | : June 6, 2023 |
| INVENTOR(S) | : Yaojian Leng |

It is certified that error appears in the above-identified patent and that said Letters Patent is hereby corrected as shown below:

On the Title Page

Item (71) Applicant: "Microchip Technology incorporated" ---Change to--- "Microchip Technology Incorporated"

Signed and Sealed this
Eleventh Day of July, 2023

Katherine Kelly Vidal
*Director of the United States Patent and Trademark Office*